(12) United States Patent
Radu et al.

(10) Patent No.: US 10,439,140 B2
(45) Date of Patent: Oct. 8, 2019

(54) HOLE TRANSPORT MATERIALS

(71) Applicant: LG Chem, Ltd., Seoul (KR)

(72) Inventors: Nora Sabina Radu, Landenberg, PA (US); Kerwin D. Dobbs, Wilmington, DE (US); Adam Fennimore, Wilmington, DE (US); Weiying Gao, Landenberg, PA (US); Gene M. Rossi, Wilmington, DE (US); Juergen Weber, Lincoln University, PA (US)

(73) Assignee: LG Chem, Ltd. (KR)

( * ) Notice: Subject to any disclaimer, the term of this patent is extended or adjusted under 35 U.S.C. 154(b) by 70 days.

(21) Appl. No.: 15/528,189

(22) PCT Filed: Nov. 18, 2015

(86) PCT No.: PCT/US2015/061309
§ 371 (c)(1),
(2) Date: May 19, 2017

(87) PCT Pub. No.: WO2016/081583
PCT Pub. Date: May 26, 2016

(65) Prior Publication Data
US 2017/0358750 A1    Dec. 14, 2017

Related U.S. Application Data

(60) Provisional application No. 62/082,232, filed on Nov. 20, 2014, provisional application No. 62/157,531, (Continued)

(51) Int. Cl.
*H01L 51/50* (2006.01)
*H01L 51/00* (2006.01)
*C08G 61/12* (2006.01)

(52) U.S. Cl.
CPC .......... *H01L 51/0035* (2013.01); *C08G 61/12* (2013.01); *C08G 61/124* (2013.01); (Continued)

(58) Field of Classification Search
None
See application file for complete search history.

(56) References Cited

U.S. PATENT DOCUMENTS 6,670,645 B2    12/2003    Grushin et al.
7,351,358 B2    4/2008    Hsu et al.
(Continued)

FOREIGN PATENT DOCUMENTS

JP    09-310066 A    12/1997
JP    2009-021335 A    1/2009
(Continued)

OTHER PUBLICATIONS

Wang, Y., Kirk-Othmer Encyclopedia of Chemical Technology, Fourth Edition, 1996, vol. 18, pp. 837-860 (Book Not Included).
(Continued)

*Primary Examiner* — Gregory D Clark
(74) *Attorney, Agent, or Firm* — Lerner, David, Littenberg, Krumholz & Mentlik, LLP

(57) ABSTRACT

There is provided a hole transport polymer having a carbazole group and an amino nitrogen having Formula I
(Continued)

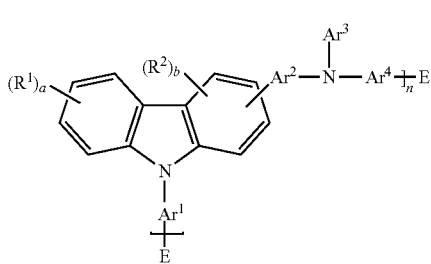

Formula I

In the formula: $Ar^1$, $Ar^2$, and $Ar^4$ are the same or different and are substituted or unsubstituted aryl groups or deuterated aryl groups; $Ar^3$ is substituted or unsubstituted aryl groups or deuterated aryl groups; E is the same or different at each occurrence and is selected from the group consisting of H, D, halide, alkyl, aryl, siloxane, deuterated alkyl, deuterated aryl, deuterated siloxane, and a crosslinking group; $R^1$-$R^2$ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring; a is an integer from 0-4; b is an integer from 0-3; and n is an integer greater than or equal to 1.

6 Claims, 2 Drawing Sheets

Related U.S. Application Data filed on May 6, 2015, provisional application No. 62/251,405, filed on Nov. 5, 2015.

(52) U.S. Cl.
CPC .... *H01L 51/0043* (2013.01); *C08G 2261/124* (2013.01); *C08G 2261/148* (2013.01); *C08G 2261/1412* (2013.01); *C08G 2261/1646* (2013.01); *C08G 2261/312* (2013.01); *C08G 2261/3162* (2013.01); *C08G 2261/3241* (2013.01); *C08G 2261/41* (2013.01); *C08G 2261/512* (2013.01); *C08G 2261/95* (2013.01); *H01L 51/5056* (2013.01)

(56) References Cited

U.S. PATENT DOCUMENTS 8,465,848 B2 6/2013 Smith

| | | | |
|---|---|---|---|
| 2002/0076576 A1* | 6/2002 | Li | H01L 51/0038 428/690 |
| 2004/0102577 A1 | 5/2004 | Hsu et al. | |
| 2004/0127637 A1 | 7/2004 | Hsu et al. | |
| 2004/0158017 A1* | 8/2004 | O'Dell | C08G 61/02 528/4 |
| 2005/0184287 A1 | 8/2005 | Herron et al. | |
| 2005/0205860 A1 | 9/2005 | Hsu et al. | |
| 2011/0017983 A1* | 1/2011 | Mizuki | C08G 61/12 257/40 |
| 2012/0049167 A1 | 3/2012 | Kuramochi et al. | |
| 2014/0193937 A1 | 7/2014 | Humphries et al. | |
| 2014/0235800 A1 | 8/2014 | Humphries et al. | |
| 2014/0291651 A1 | 10/2014 | Humphries et al. | |
| 2017/0170400 A1* | 6/2017 | Spencer | C08G 61/12 |

FOREIGN PATENT DOCUMENTS

| | | |
|---|---|---|
| KR | 10-2009-0028943 A | 3/2009 |
| KR | 10-2010-0111767 A | 10/2010 |
| WO | 2003/008424 A1 | 1/2003 |
| WO | 2003/040257 A1 | 5/2003 |
| WO | 2003/063555 A1 | 7/2003 |
| WO | 2003/091688 A2 | 11/2003 |
| WO | 2004/016710 A1 | 2/2004 |
| WO | 2005/052027 A1 | 6/2005 |
| WO | 2007/145979 A3 | 4/2008 |
| WO | 2009/018009 A1 | 2/2009 |
| WO | 2011/028216 A1 | 3/2011 |
| WO | 2011/159872 A1 | 12/2011 |
| WO | 2013/098113 A2 | 7/2013 |
| WO | 2014/021571 A1 | 2/2014 |
| WO | 2015/089304 A1 | 6/2015 |

OTHER PUBLICATIONS

Podzimek, Z. "The Use of GPC Coupled with a Multiangle laser Light Scattering Photometer for the Characterization of Polymers. On the Determination of Molecular Weight, Size, and Branching," Journal of Applied Polymer Science, 1994, vol. 54, 91-103.
PCT International Search Report, Application No. PCT/US2016/059288; Kim Dong Seok, Authorized Officer, ISA/KR, ; dated Feb. 6, 2017.
PCT International Search Report for Application No. PCT/US2015/061309; Chang Bong Ho, Authorized Officer; ISA/KR; dated Mar. 2, 2016.
Hitosugi et al. "A Facile Chromatographic Method for Purification of Pinacol Boronic Esters," Chem. Lett. 2012, 41, pp. 972-973.
Gustafsson, G. et al. "Flexible light-emitting diodes made from soluble conducting polymers," Letters to Nature, Jun. 11, 1992, vol. 357, pp. 477-479.
CRC Handbook of Chemistry and Physics, 81st Edition, 2000-2001 (Book Not Included).
Agilent Technologies publication "A guide to multi-detector gel permeation chromatography," 2012, pp. 1-24, www.agilent.com/cs/library/primers/public/5990-7196EN.pdf.

* cited by examiner

HOLE TRANSPORT MATERIALS

RELATED APPLICATION DATA

This application claims the benefit of U.S. Provisional Application No. 62/082,232 filed on Nov. 20, 2014; U.S. Provisional Application No. 62/157,531 filed on May 6, 2015; and U.S. Provisional Application No. 62/251,405 filed on Nov. 5, 2015; all of which are incorporated by reference herein in their entirety.

BACKGROUND INFORMATION

Field of the Disclosure

The present disclosure relates to novel hole transport compounds. The disclosure further relates to electronic devices having at least one layer comprising such an hole transport compound.

Description of the Related Art

In organic electronic devices, such as organic light emitting diodes ("OLED"), that make up OLED displays, one or more organic electroactive layers are sandwiched between two electrical contact layers. In an OLED at least one organic electroactive layer emits light through the light-transmitting electrical contact layer upon application of a voltage across the electrical contact layers.

It is well known to use organic electroluminescent compounds as the light-emitting component in light-emitting diodes. Simple organic molecules, conjugated polymers, and organometallic complexes have been used.

Devices that use electroluminescent materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for electroactive materials for use in electronic devices.

SUMMARY

There is provided a hole transport polymer having a carbazole group and an amino nitrogen, wherein said polymer has Formula I

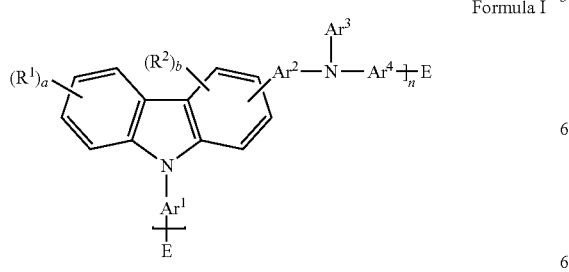

Formula I wherein:

$Ar^1$, $Ar^2$, and $Ar^4$ are the same or different and are substituted or unsubstituted aryl groups or deuterated aryl groups;

$Ar^3$ is substituted or unsubstituted aryl groups or deuterated aryl groups;

E is the same or different at each occurrence and is selected from the group consisting of H, D, halide, alkyl, aryl, siloxane, ester deuterated alkyl, deuterated aryl, deuterated siloxane, deuterated ester, and a crosslinking group;

$R^1$-$R^2$ are the same or different at each occurrence and are selected from the group consisting of D, F, CN, alkyl, fluoroalkyl, aryl, heteroaryl, amino, silyl, germyl, ester, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated ester, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;

a is an integer from 0-4;

b is an integer from 0-3; and n is an integer greater than or equal to1.

There is also provided a monomer having a carbazole group and an amino nitrogen, wherein said monomer has Formula Ia

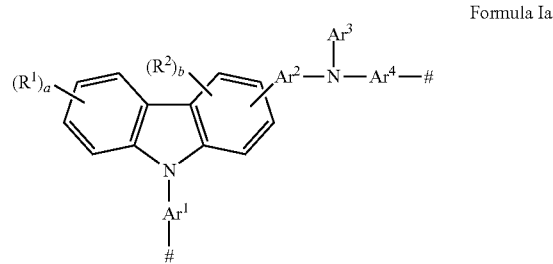

Formula Ia wherein:

$Ar^1$, $Ar^2$, and $Ar^4$ are the same or different and are substituted or unsubstituted aryl groups or deuterated aryl groups;

$Ar^3$ is substituted or unsubstituted aryl groups or deuterated aryl groups;

$R^1$-$R^2$ are the same or different at each occurrence and are selected from the group consisting of D, F, CN, alkyl, fluoroalkyl, aryl, heteroaryl, amino, silyl, germyl, alkoxy, ester, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated ester, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;

a is an integer from 0-4;

b is an integer from 0-3; and # is a point of attachment to other monomeric units.

There is also provided a hole transport polymer having a carbazole group and an amino nitrogen, wherein said polymer has Formula II Formula II

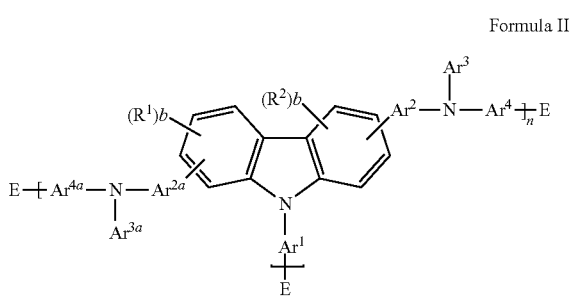

wherein:
  $Ar^1$, $Ar^2$, $Ar^{2a}$, $Ar^4$, and $Ar^{4a}$ are the same or different and are substituted or unsubstituted aryl groups or deuterated aryl groups;
  $Ar^3$ and $Ar^{3a}$ are substituted or unsubstituted aryl groups or deuterated aryl groups;
  E is the same or different at each occurrence and is selected from the group consisting of H, D, halide, alkyl, aryl, siloxane, ester, deuterated alkyl, deuterated aryl, deuterated siloxane, deuterated ester, and a crosslinking group;
  $R^1$-$R^2$ are the same or different at each occurrence and are selected from the group consisting of D, F, CN, alkyl, fluoroalkyl, aryl, heteroaryl, amino, silyl, germyl, ester, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated ester, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;
  b is an integer from 0-3; and
  n is an integer greater than or equal to 1.

There is also provided a monomer having a carbazole group and an amino nitrogen, wherein said monomer has Formula IIa Formula IIa

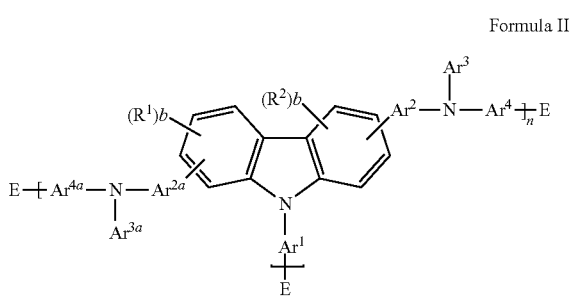

wherein:
  $Ar^1$, $Ar^2$, $Ar^{2a}$, $Ar^4$, and $Ar^{4a}$ are the same or different and are substituted or unsubstituted aryl groups or deuterated aryl groups;
  $Ar^3$ and $Ar^{3a}$ are substituted or unsubstituted aryl groups or deuterated aryl groups;
  $R^1$-$R^2$ are the same or different at each occurrence and are selected from the group consisting of D, F, CN, alkyl, fluoroalkyl, aryl, heteroaryl, amino, silyl, germyl, ester, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated ester, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;
  b is an integer from 0-3; and
  # is a point of attachment to other monomeric units.

There is also provided a hole transport copolymer having Formula III

Formula III wherein:
  A is a monomeric unit having Formula Ia or Formula IIa;
  B is a monomeric unit having at least three points of attachment in the copolymer;
  C is an aromatic monomeric unit or a deuterated analog thereof;
  E is the same or different at each occurrence and is selected from the group consisting of H, D, halide, alkyl, aryl, arylamino, siloxane, ester, crosslinkable groups, deuterated alkyl, deuterated aryl, deuterated arylamino, deuterated siloxane, deuterated ester, and deuterated crosslinkable groups;
  x, y, and z are the same or different and are mole fractions, such that x+y+z=1, and x and y are non-zero.

There is also provided an electronic device having at least one layer comprising a polymer of Formula I, Formula II, or a copolymer of Formula III.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
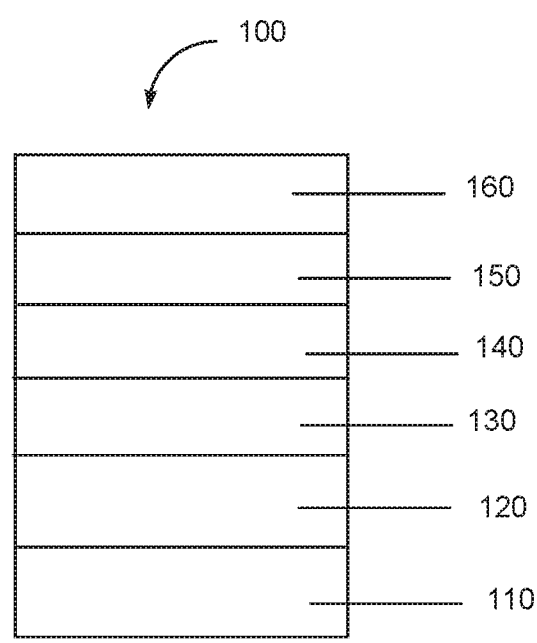
FIG. 1 includes an illustration of one example of an organic electronic device including the new hole transport polymer or copolymer described herein.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a hole transport polymer having a carbazole group and an amino nitrogen, wherein said polymer has Formula I

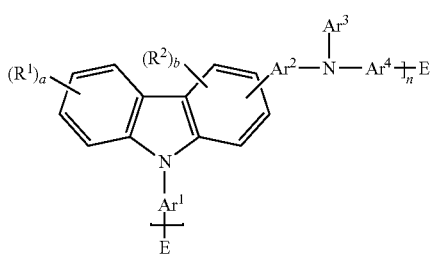

Formula I wherein:
- $Ar^1$, $Ar^2$, and $Ar^4$ are the same or different and are substituted or unsubstituted aryl groups or deuterated aryl groups;
- $Ar^3$ is substituted or unsubstituted aryl groups or deuterated aryl groups;
- E is the same or different at each occurrence and is selected from the group consisting of H, D, halide, alkyl, aryl, siloxane, ester, deuterated alkyl, deuterated aryl, deuterated siloxane, deuterated ester, and a crosslinking group;
- $R^1$-$R^2$ are the same or different at each occurrence and are selected from the group consisting of D, F, CN, alkyl, fluoroalkyl, aryl, heteroaryl, amino, silyl, germyl, ester, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, deuterated ester, and crosslinking groups, wherein adjacent groups selected from $R^1$ and $R^2$ can be joined together to form a fused ring;
- a is an integer from 0-4;
- b is an integer from 0-3; and
- n is an integer greater than or equal to 1.

There is also provided a monomer having a carbazole group and an amino nitrogen, wherein said monomer has Formula Ia

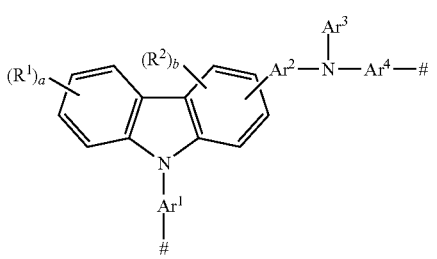

Formula Ia wherein:
- $Ar^1$, $Ar^2$, and $Ar^4$ are the same or different and are substituted or unsubstituted aryl groups or deuterated aryl groups;
- $Ar^3$ is substituted or unsubstituted aryl groups or deuterated aryl groups;
- $R^1$-$R^2$ are the same or different at each occurrence and are selected from the group consisting of D, F, CN, alkyl, fluoroalkyl, aryl, heteroaryl, amino, silyl, germyl, ester, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated ester, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;
- a is an integer from 0-4;
- b is an integer from 0-3; and
- # is a point of attachment to other monomeric units.

There is also provided a hole transport polymer having a carbazole group and an amino nitrogen, wherein said polymer has Formula II Formula II wherein:
- $Ar^1$, $Ar^2$, $Ar^{2a}$, $Ar^4$, and $Ar^{4a}$ are the same or different and are substituted or unsubstituted aryl groups or deuterated aryl groups;
- $Ar^3$ and $Ar^{3a}$ are substituted or unsubstituted aryl groups or deuterated aryl groups;
- E is the same or different at each occurrence and is selected from the group consisting of H, D, halide, alkyl, aryl, siloxane, ester, deuterated alkyl, deuterated aryl, deuterated siloxane, deuterated ester, and a crosslinking group;
- $R^1$-$R^2$ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, ester, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, deuterated ester, and crosslinking groups, wherein adjacent groups selected from $R^1$ and $R^2$ can be joined together to form a fused ring;
- b is an integer from 0-3; and
- n is an integer greater than or equal to 1.

There is also provided a monomer having a carbazole group and an amino nitrogen, wherein said monomer has Formula IIa Formula IIa wherein:
Ar$^1$, Ar$^2$, Ar$^{2a}$, Ar$^4$, and Ar$^{4a}$ are the same or different and are substituted or unsubstituted aryl groups or deuterated aryl groups;

Ar$^3$ and Ar$^{3a}$ are substituted or unsubstituted aryl groups or deuterated aryl groups;

R$^1$-R$^2$ are the same or different at each occurrence and are selected from the group consisting of D, F, CN, alkyl, fluoroalkyl, aryl, heteroaryl, amino, silyl, germyl, ester, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated ester, deuterated alkoxy, deuterated aryloxy, deuterated fluoroalkoxy, deuterated siloxane, deuterated siloxy, and crosslinking groups, wherein adjacent groups selected from R$^1$ and R$^2$ can be joined together to form a fused ring;

b is an integer from 0-3; and

\# is a point of attachment to other monomeric units.

There is also provided a hole transport copolymer having Formula III

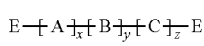

Formula III wherein:
A is a monomeric unit having Formula Ia or Formula IIa;

B is a monomeric unit having at least three points of attachment in the copolymer;

C is an aromatic monomeric unit or a deuterated analog thereof;

E is the same or different at each occurrence and is selected from the group consisting of H, D, halide, alkyl, aryl, arylamino, siloxane, ester, crosslinkable groups, deuterated alkyl, deuterated aryl, deuterated arylamino, deuterated siloxane, deuterated ester, and deuterated crosslinkable groups;

x, y, and z are the same or different and are mole fractions, such that x+y+z=1, and x and y are non-zero.

There is also provided an electronic device having at least one layer comprising a polymer of Formula I, Formula II, or a copolymer of Formula III.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description and from the claims. The detailed description first addresses Definitions and Clarification of Terms, followed by the Compound, the Electronic Device, and finally Examples.

1 Definitions and Clarification of Terms

Before addressing details of embodiments described below, some terms are defined or clarified.

As used herein, the term "adjacent" as it refers to substituent groups refers to groups that are bonded to carbons that are joined together with a single or multiple bond. Exemplary adjacent R groups are shown below:

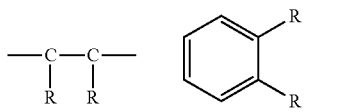

The term "alkoxy" is intended to mean the group RO-x, where R is an alkyl group.

The term "alkyl" includes branched and straight-chain saturated aliphatic hydrocarbon groups. Unless otherwise indicated, the term is also intended to include cyclic groups. Examples of alkyl groups include methyl, ethyl, propyl, isopropyl, isobutyl, secbutyl, tertbutyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and tri-substituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms.

The term "amino group" is intended to mean the group —NR$_2$, where R is the same or different at each occurrence and can be an alkyl group, an aryl group, or deuterated analogs thereof.

The term "aromatic compound" is intended to mean an organic compound comprising at least one unsaturated cyclic group having delocalized pi electrons. The term is intended to encompass both aromatic compounds having only carbon and hydrogen atoms, and heteroaromatic compounds wherein one or more of the carbon atoms within the cyclic group has been replaced by another atom, such as nitrogen, oxygen, sulfur, or the like.

The term "aryl" or "aryl group" means a moiety derived from an aromatic compound. A group "derived from" a compound, indicates the radical formed by removal of one or more H or D. The aryl group may be a single ring (monocyclic) or multiple rings (bicyclic, or more) fused together or linked covalently. Examples of aryl moieties include, but are not limited to, phenyl, 1-naphthyl, 2-naphthyl, dihydronaphthyl, tetrahydronaphthyl, biphenyl, anthryl, phenanthryl, fluorenyl, indanyl, biphenylenyl, acenaphthenyl, acenaphthylenyl, and the like. In some embodiments, aryl groups have 6 to 60 ring carbon atoms; in some embodiments, 6 to 30 ring carbon atoms. The term is intended to include hydrocarbon aryls, having only carbon atoms and hydrogen atoms; and heteroaryls, having at least one heteroatom in one or more of the rings. Heteroaryl groups may have from 4-50 ring carbon atoms; in some embodiments, 4-30 ring carbon atoms.

The term "aryloxy" is intended to mean the group —OR, where R is aryl.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport materials facilitate negative charge. Although light-emitting materials may also have some charge transport properties, the term "charge transport layer, material, member, or structure" is not intended to include a layer, material, member, or structure whose primary function is light emission.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "crosslinkable group" or "crosslinking group" is intended to mean a group on a compound or polymer chain than can link to another compound or polymer chain via thermal treatment, use of an initiator, or exposure to radiation, where the link is a covalent bond. In some embodiments, the radiation is UV or visible. Examples of crosslinkable groups include, but are not limited to vinyl, acrylate, perfluorovinylether, 1-benzo-3,4-cyclobutane, o-quinodimethane groups, siloxane, cyanate groups, cyclic ethers (epoxides), internal alkenes (e.g., stillbene) cycloalkenes, and acetylenic groups.

The term "electroactive" as it refers to a layer or a material, is intended to indicate a layer or material which electronically facilitates the operation of the device. Examples of electroactive materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The prefix "fluoro" is intended to indicate that one or more hydrogens in a group has been replaced with fluorine.

The prefix "hetero" indicates that one or more carbon atoms has been replaced with a different atom. In some embodiments, the heteroatom is O, N, S, or combinations thereof.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "molecular weight" (of polymer with "n" repeat units) is intended to mean the total mass of a polymeric molecule and is calculated as the sum of the mass of each constituent atom multiplied by the number of atoms of that element in the polymeric formula. The practical upper limit of n is determined in part by the desired solubility of a compound in a particular solvent or class of solvents. As the value of n increases, the molecular weight of the compound increases.

The term "monomeric unit" is intended to mean a repeating unit in a polymer. It represents the largest constitutional unit contributed by a single monomer to the structure of a polymer.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "polymer" is intended to mean a material having at least one repeating monomeric unit. The term includes homopolymers having only one kind of monomeric unit, and copolymers having two or more different monomeric units. Copolymers are a subset of polymers.

The term "siloxane" refers to the group $R_3SiOR_2Si$—, where R is the same or different at each occurrence and is H, D, $C_{1-20}$ alkyl, deuterated alkyl, fluoroalkyl, aryl, or deuterated aryl. In some embodiments, one or more carbons in an R alkyl group are replaced with Si.

The term "siloxy" refers to to the group $R_3SiO$—, where R is the same or different at each occurrence and is H, D, $C_{1-20}$ alkyl, deuterated alkyl, fluoroalkyl, aryl, or deuterated aryl.

The term "silyl" refers to the group $R_3Si$—, where R is the same or different at each occurrence and is H, D, $C_{1-20}$ alkyl, deuterated alkyl, fluoroalkyl, aryl, or deuterated aryl. In some embodiments, one or more carbons in an R alkyl group are replaced with Si.

Unless otherwise indicated, all groups can be substituted or unsubstituted. An optionally substituted group, such as, but not limited to, alkyl or aryl, may be substituted with one or more substituents which may be the same or different. Suitable substituents include D, alkyl, aryl, nitro, cyano, —N(R')(R"), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxane, thioalkoxy, —S(O)$_2$—N(R')(R"), —C(=O)—N(R')(R"), (R')(R")N-alkyl, (R')(R")N-alkoxyalkyl, (R')(R")N-alkylaryloxyalkyl, —S(O)$_s$-aryl (where s=0–2) or —S(O)$_s$-heteroaryl (where s=0–2). Each R' and R" is independently an optionally substituted alkyl, cycloalkyl, or aryl group. R' and R", together with the nitrogen atom to which they are bound, can form a ring system in certain embodiments. Substituents may also be crosslinking groups.

In a structure where a substituent bond passes through one or more rings as shown below,

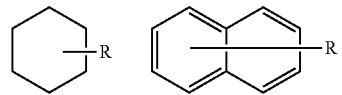

it is meant that the substituent R may be bonded at any available position on the one or more rings.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the CRC Handbook of Chemistry and Physics, 81$^{st}$ Edition (2000-2001).

In this specification, unless explicitly stated otherwise or indicated to the contrary by the context of usage, chemical and structural formulae may be depicted using the line-angle formula convention. In a line-angle formula, bonds are represented by lines, and carbon atoms are assumed to be present wherever two lines meet or a line begins or ends. Nitrogen, oxygen, halogens, and other heteroatoms are shown; but hydrogen atoms are not usually drawn when bonded to carbon. Each sp$^3$ carbon atom is assumed to have enough bonded hydrogen atoms in order to give it a total of four bonds; each sp$^2$ carbon, three bonds; each sp carbon, two bonds. The depiction of Formula I herein is an example of the use of the line-angle formula convention.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2a. Hole Transport Polymer Having Formula I

The hole transport polymer having a carbazole group and an amino nitrogen described herein has Formula I

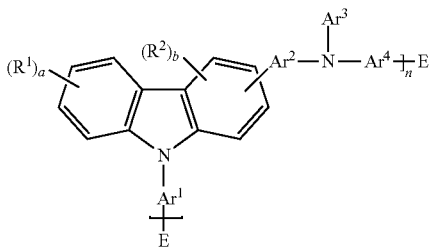

Formula I wherein:
Ar$^1$, Ar$^2$, and Ar$^4$ are the same or different and are substituted or unsubstituted aryl groups or deuterated aryl groups;
Ar$^3$ is substituted or unsubstituted aryl groups or deuterated aryl groups;
E is the same or different at each occurrence and is selected from the group consisting of H, D, halide, alkyl, aryl, siloxane, ester, deuterated alkyl, deuterated aryl, deuterated siloxane, deuterated ester, and a crosslinking group;
R$^1$-R$^2$ are the same or different at each occurrence and are selected from the group consisting of D, F, CN, alkyl, fluoroalkyl, aryl, heteroaryl, amino, silyl, germyl, alkoxy, ester, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated ester, deuterated aryloxy, deuterated fluoroalkoxy, deuterated siloxane, deuterated siloxy, and crosslinking groups, wherein adjacent groups selected from R$^1$ and R$^2$ can be joined together to form a fused ring;
a is an integer from 0-4;
b is an integer from 0-3; and
n is an integer greater than or equal to 1.

As used herein, the term "hole transport polymer having a carbazole group and an amino nitrogen having Formula I" is intended to designate a polymer based on a repeat unit, or monomer, as defined by Formula I. Polymerization sites are the aryl halide groups attached to the nitrogen centers (amine and carbazole) within each monomer. This class of materials leads to monomers of AB type and generates polymeric hole transport films with a random distribution of AA, BB, and AB segments throughout the polymer. This can result in differential degrees of non-associative packing that ultimately determines the associated film-forming properties. In some embodiments, the distribution of monomeric segments can be manipulated so as to optimize properties of compounds having Formula I for use in electronic devices.

In some embodiments, the compound having Formula I is deuterated. The term "deuterated" is intended to mean that at least one H has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level. In some embodiments, the compound is at least 10% deuterated. By "% deuterated" or "% deuteration" is meant the ratio of deuterons to the sum of protons plus deuterons, expressed as a percentage. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Deuterated materials can be less susceptible to degradation by holes, electrons, excitons, or a combination thereof. Deuteration can potentially inhibit degradation of the compound during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

In some embodiments of Formula I, n=1.
In some embodiments of Formula I, n=2-5.
In some embodiments of Formula I, n>5.
In some embodiments of Formula I, n=6-10.

In some embodiments of Formula I, the compound is a polymer with n>10. In some embodiments of Formula I, the compound is a polymer with n>100. In some embodiments, the compound is a polymer with $M_n$>20,000; in some embodiments, $M_n$>50,000; in some embodiments, $M_n$>100,000; in some embodiments, $M_n$>150,000.

In some embodiments of Formula I, E is H or D.

In some embodiments of Formula I, E is D.

In some embodiments of Formula I, E is a halogen. In some embodiments the halogen is Cl or Br; in some embodiments, Br.

In some embodiments of Formula I, E is an aryl or deuterated aryl group; in some embodiments the aryl group is substituted; in some embodiments, the aryl group is unsubstituted.

In some embodiments of Formula I, E is a monocyclic aryl group or deuterated monocyclic aryl group.

In some embodiments of Formula I, E is an aryl group with multiple rings fused together. In some embodiments the multiple rings fused together include deuterium.

In some embodiments of Formula I, E is a heteroaryl group or deuterated heteroaryl group.

In some embodiments of Formula I, E is a siloxane group or deuterated siloxane group.

In some embodiments of Formula I, E is an ester or deuterated ester.

In some embodiments of Formula I, E is further substituted with additional groups that may or may not include deuterium.

In some embodiments of Formula I, E is a crosslinking group.

In some embodiments, one or more of $Ar^1$-$Ar^4$ is an aryl group having at least one fused ring.

In some embodiments, one or more of $Ar^1$-$Ar^4$ is selected from the group consisting of naphthyl, anthracenyl, naphthylphenyl, phenylnaphthyl, fluorenyl, substituted derivatives thereof, and deuterated analogs thereof.

In some embodiments of Formula I, $Ar^1$-$Ar^4$ are aryl groups having no fused rings.

In some embodiments of Formula I, $Ar^1$-$Ar^4$ are aryl groups that are further substituted with additional groups that may or may not include deuterium.

In some embodiments of Formula I, $Ar^1$-$Ar^4$ are hydrocarbon aryl groups.

In some embodiments of Formula I, $Ar^1$-$Ar^4$ are heteroaryl groups.

In some embodiments of Formula I, $Ar^1$-$Ar^4$ are both hydrocarbon aryl groups and heteroaryl groups.

In some embodiments of Formula I, $Ar^1$ has Formula a

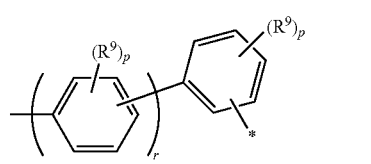

Formula a where:

$R^9$ is the same or different at each occurrence and is selected from the group consisting of D, alkyl, alkoxy, siloxane and silyl, wherein adjacent $R^9$ groups can be joined together to form a fused ring;

p is the same or different at each occurrence and is an integer from 0-4;

r is an integer from 1 to 5; and

*indicates the point of attachment to E.

In some embodiments, $Ar^1$ has Formula b

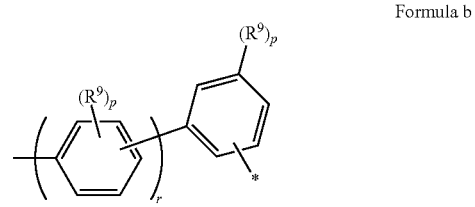

Formula b where $R^9$, p, r and * are as in Formula a.

In some embodiments of Formula I, $Ar^1$ has Formula c

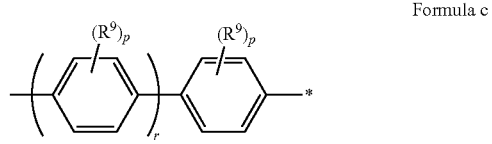

Formula c where $R^9$, p, r and * are as in Formula a.

In some embodiments of Formula I, $Ar^1$ is selected from the group consisting of 1-naphthyl, 2-naphthyl, anthracenyl, fluorenyl, deuterated analogs thereof, and derivatives thereof having one or more substituents selected from the group consisting of fluoro, alkyl, alkoxy, silyl, siloxy, a substituent with a crosslinking group, and deuterated analogs thereof.

In some embodiments of Formula I, $Ar^4$ has Formula a.

In some embodiments of Formula I, $Ar^4$ has Formula b.

In some embodiments of Formula I, $Ar^4$ has Formula c.

In some embodiments of Formula I, $Ar^4$ is selected from the group consisting of 1-naphthyl, 2-naphthyl, anthracenyl, fluorenyl, deuterated analogs thereof, and derivatives thereof having one or more substituents selected from the group consisting of fluoro, alkyl, alkoxy, silyl, siloxy, a substituent with a crosslinking group, and deuterated analogs thereof.

In some embodiments of Formula a-c, at least one p is not zero.

In some embodiments of Formula a-c, r=1-3.

In some embodiments of Formula I, $Ar^1$=$Ar^4$.

In some embodiments of Formula I, $Ar^1$ and $Ar^4$ are selected from the group consisting of phenyl, biphenyl, terphenyl, deuterated analogs thereof, and derivatives thereof having one or more substituents selected from the group consisting of fluoro, alkyl, alkoxy, silyl, siloxy, a substituent with a crosslinking group, and deuterated analogs thereof.

In some embodiments of Formula I, $Ar^2$ has Formula a'

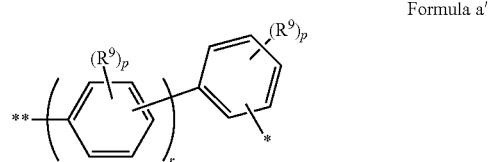

Formula a' where:
- $R^9$ is the same or different at each occurrence and is selected from the group consisting of D, alkyl, alkoxy, siloxane and silyl, wherein adjacent $R^9$ groups can be joined together to form a fused ring;
- p is the same or different at each occurrence and is an integer from 0-4;
- r is an integer from 1 to 5; and
- * indicates the point of attachment to the amino-Nitrogen atom;
- ** indicates the point of attachment to the aromatic ring of the carbazole.

In some embodiments, $Ar^2$ has Formula b'

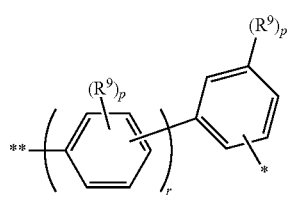

Formula b' where $R^9$, p, r, *, and ** are as in Formula a'.

In some embodiments of Formula I, $Ar^2$ has Formula c'

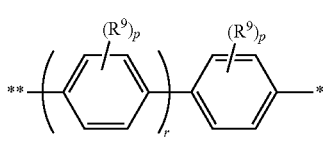

Formula c' where $R^9$, p, r, *, and ** are as in Formula a'.

In some embodiments of Formula I, $Ar^2$ is selected from the group consisting of 1-naphthyl, 2-naphthyl, anthracenyl, fluorenyl, deuterated analogs thereof, and derivatives thereof having one or more substituents selected from the group consisting of fluoro, alkyl, alkoxy, silyl, siloxy, a substituent with a crosslinking group, and deuterated analogs thereof.

In some embodiments of Formulae a'-c', at least one p is not zero.

In some embodiments of Formulae a'-c', r=1-3.

In some embodiments of Formula I, $Ar^3$ has Formula d

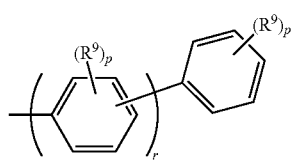

Formula d where:
- $R^9$ is the same or different at each occurrence and is selected from the group consisting of D, alkyl, alkoxy, siloxane and silyl, wherein adjacent $R^9$ groups can be joined together to form a fused ring;
- p is the same or different at each occurrence and is an integer from 0-4;
- q is an integer from 0-5; and
- r is an integer from 1 to 5.

In some embodiments of Formula I, $Ar^3$ has Formula e

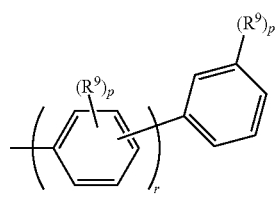

Formula e where $R^9$, p, and, r are as in Formula d.

In some embodiments of Formula I, $Ar^3$ has Formula f

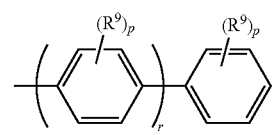

Formula f where $R^9$, p, and, r are as in Formula d.

In some embodiments of Formula I, $Ar^3$ is selected from the group consisting of 1-naphthyl, 2-naphthyl, anthracenyl, fluorenyl, deuterated analogs thereof, and derivatives thereof having one or more substituents selected from the group consisting of fluoro, alkyl, alkoxy, silyl, siloxy, a substituent with a crosslinking group, and deuterated analogs thereof.

In some embodiments of Formula I, a=0.
In some embodiments of Formula I, a=1.
In some embodiments of Formula I, a=2.
In some embodiments of Formula I, a=3.
In some embodiments of Formula I, a=4.
In some embodiments of Formula I, a>0 and $R^1$ is D or $C_{1-10}$ alkyl. In some embodiments, the alkyl group is deuterated.
In some embodiments of Formula I, a>0 and $R^1$ is $C_{1-10}$ silyl. In some embodiments, the silyl group is deuterated.
In some embodiments of Formula I, a>0 and $R^1$ is a germyl group. In some embodiments, the germyl group is deuterated.
In some embodiments of Formula I, a>0 and $R^1$ is an ester group. In some embodiments, the ester group is deuterated.
In some embodiments of Formula I, a>0 and $R^1$ is $C_{6-20}$ aryl or $C_{6-20}$ deuterated aryl. In some embodiments, the aryl group is a hydrocarbon aryl. In some embodiments, the aryl is a heteroaryl.
In some embodiments of Formula I, a>0 and $R^1$ is an amino group. In some embodiments, the amino group is deuterated.
In some embodiments of Formula I, a=4 and $R^1$=D.
In some embodiments of Formula I, $R^1$ and $R^2$ are the same.
In some embodiments of Formula I, $R^1$ and $R^2$ are different.
In some embodiments of Formula I, b=0.
In some embodiments of Formula I, b=1.
In some embodiments of Formula I, b=2.
In some embodiments of Formula I, b=3.
In some embodiments of Formula I, b>0 and $R^2$ is D or $C_{1-10}$ alkyl. In some embodiments, the alkyl group is deuterated.

In some embodiments of Formula I, b>0 and $R^2$ is $C_{1-10}$ silyl. In some embodiments, the silyl group is deuterated.

In some embodiments of Formula I, b>0 and $R^2$ is a germyl group. In some embodiments, the germyl group is deuterated.

In some embodiments of Formula I, b>0 and $R^2$ is a ester group.

In some embodiments, the ester group is deuterated.

In some embodiments of Formula I, b>0 and $R^2$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula I, b=3 and $R^1$=D.

Any of the above embodiments for Formula I can be combined with one or more of the other embodiments, so long as they are not mutually exclusive. For example, the embodiment in which $Ar^1$=$Ar^4$ can be combined with the embodiment in which E=D. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula I are shown below.

Compound H1

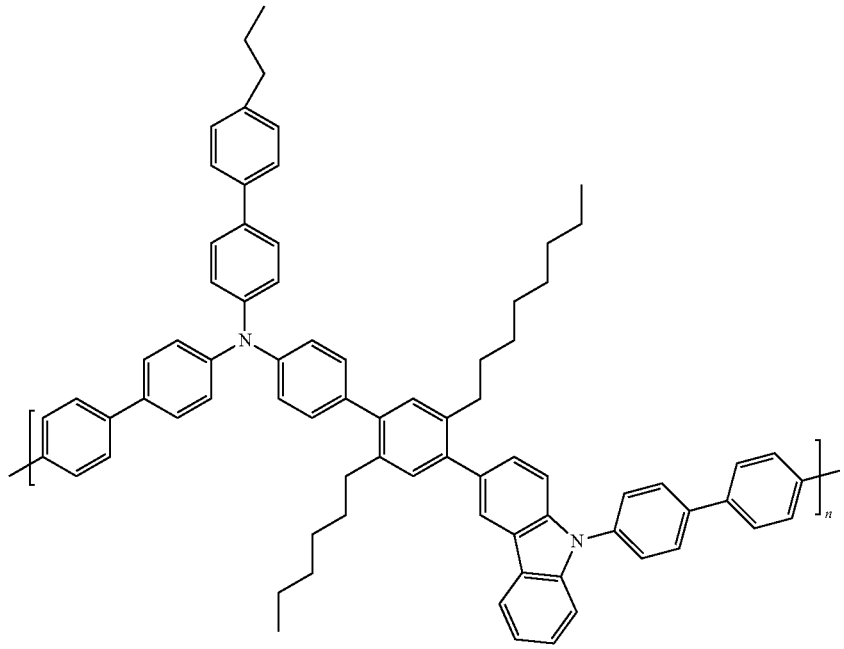

Compound H2

Compound H3

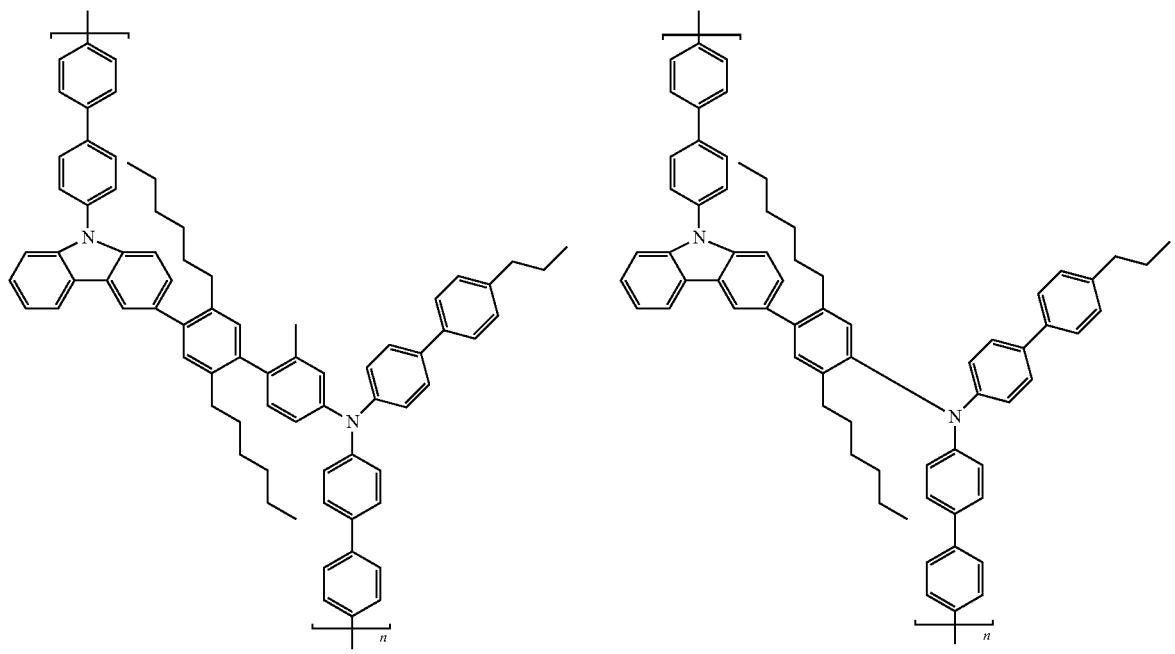

Compound H4
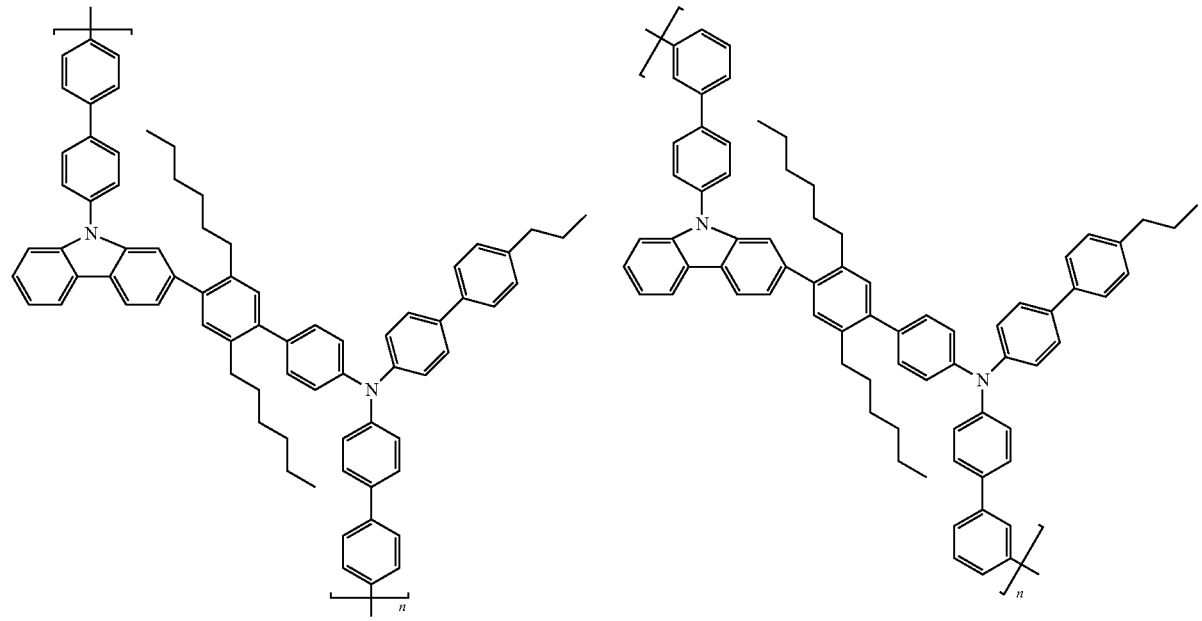
Compound H5
Compound H6
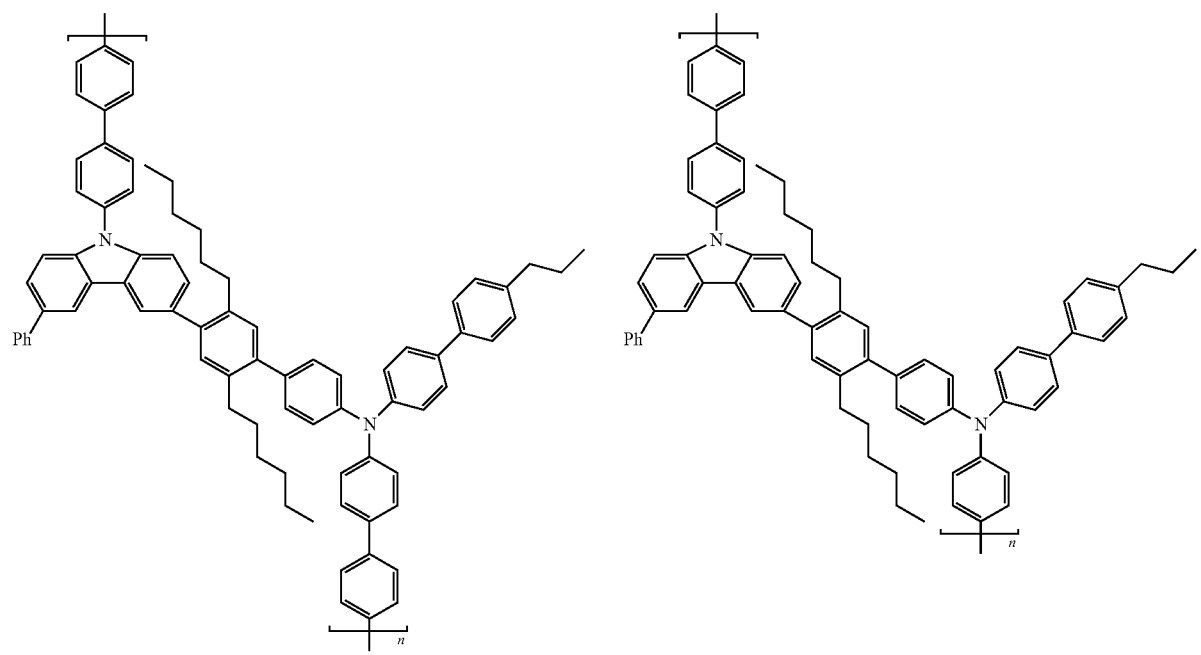
Compound H7

Compound H8
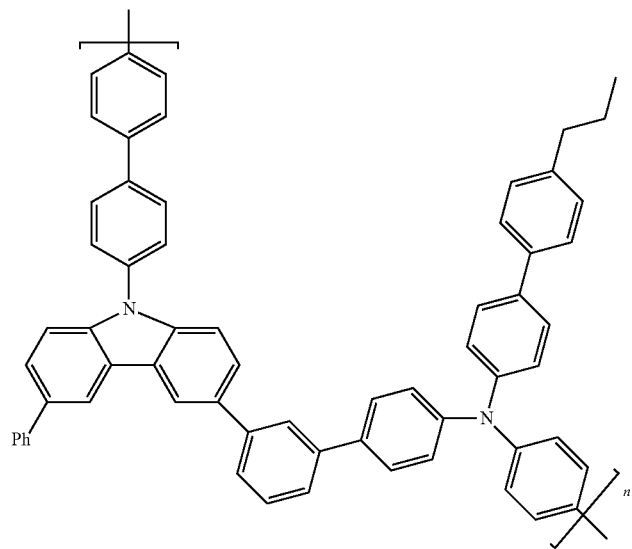
Compound H9
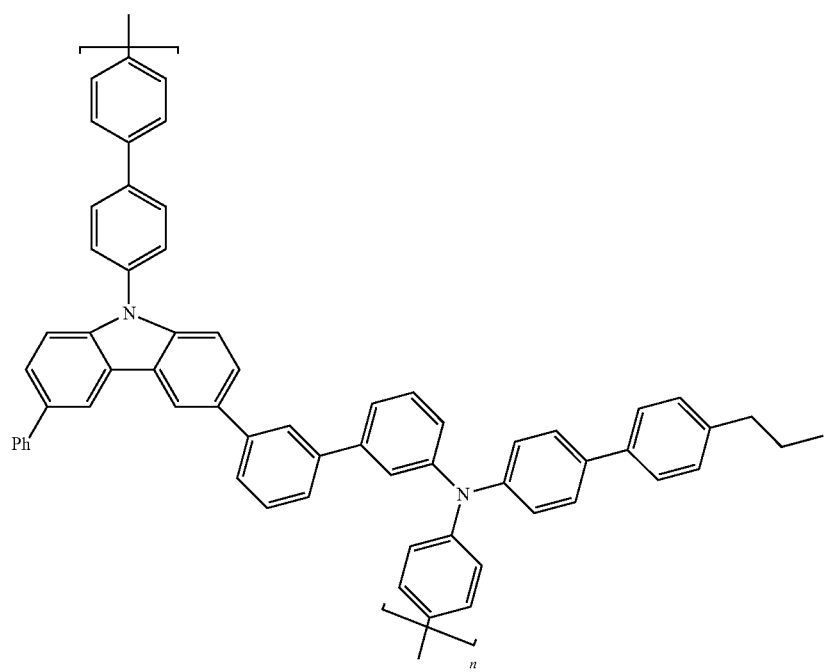

Compound H10
Compound H11
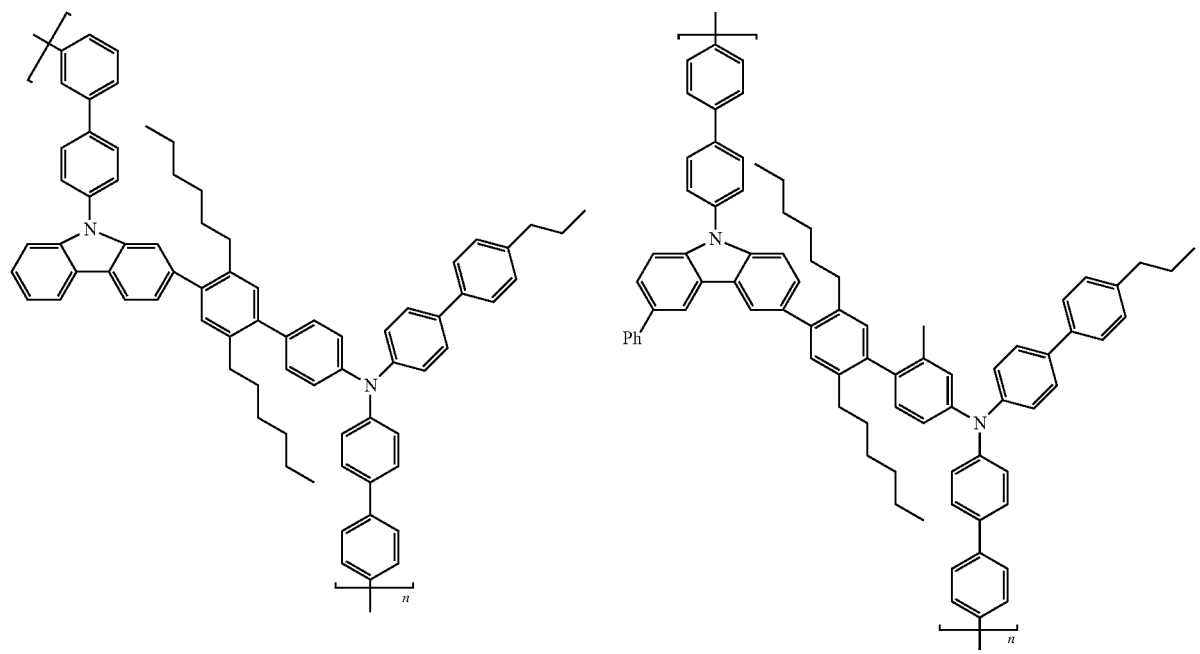
Compound H12
Compound H13
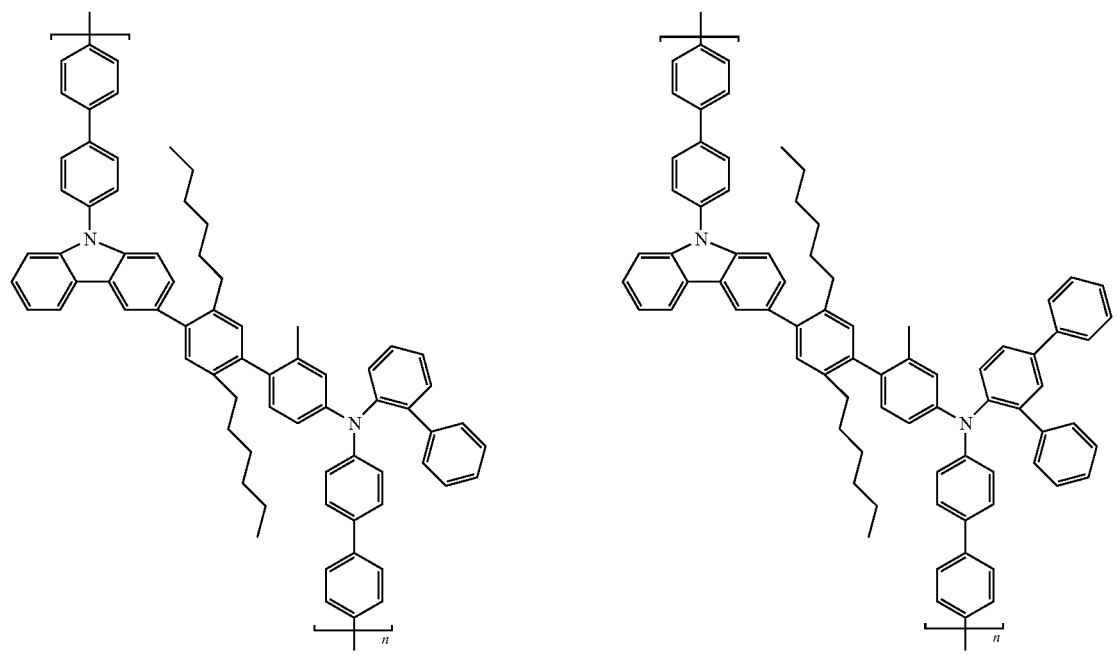

-continued

Compound H14

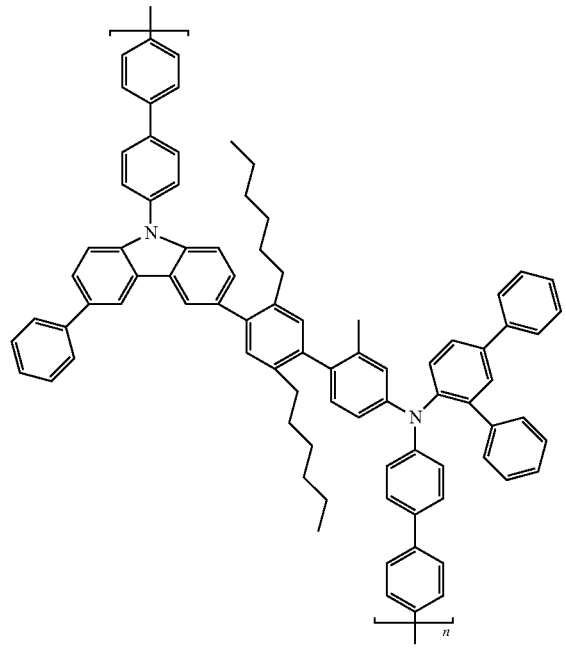

Compound H15

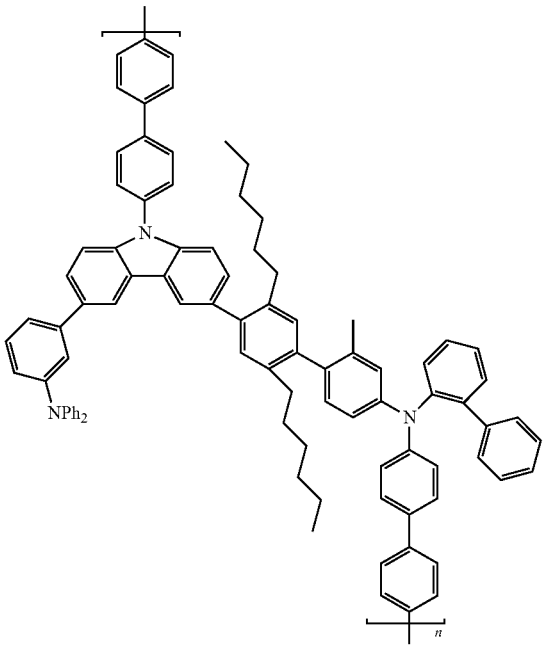

2b. Monomer Having Formula Ia
The monomer described herein has Formula Ia

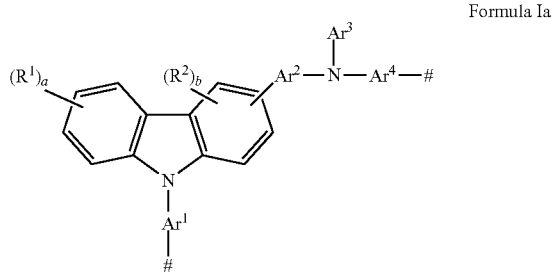

Formula Ia wherein:
$Ar^1$, $Ar^2$, and $Ar^4$ are the same or different and are substituted or unsubstituted aryl groups or deuterated aryl groups;
$Ar^3$ is substituted or unsubstituted aryl groups or deuterated aryl groups;
$R^1$-$R^2$ are the same or different at each occurrence and are selected from the group consisting of D, F, CN, alkyl, fluoroalkyl, aryl, heteroaryl, amino, ester, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated ester, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;
a is an integer from 0-4;
b is an integer from 0-3; and
# is a point of attachment to other monomeric units.

As used herein, the term "monomer having Formula Ia" is intended to designate a polymer repeat unit, or monomer, as defined by Formula Ia. Polymerization sites are designated "#" in Formula Ia. The class of polymeric materials generated from monomers of this type produces polymeric hole transport films with a random distribution of AA, BB, and AB segments throughout the polymer. This can result in differential degrees of non-associative packing that ultimately determines the associated film-forming properties. In some embodiments, the distribution of monomeric segments can be manipulated so as to optimize properties of polymers made from monomers having Formula Ia for use in electronic devices.

In some embodiments, the monomer having Formula Ia is deuterated. The term "deuterated" is intended to mean that at least one H has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level. In some embodiments, the compound is at least 10% deuterated. By "% deuterated" or "% deuteration" is meant the ratio of deuterons to the sum of protons plus deuterons, expressed as a percentage. In some embodiments, the monomer is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Deuterated materials can be less susceptible to degradation by holes, electrons, excitons, or a combination thereof. Deuteration can potentially inhibit degradation of the compound during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

All of the above embodiments for $Ar^1$-$Ar^4$ regarding the hole transport polymer having Formula I apply equally well to $Ar^1$-$Ar^4$ in the monomer having Formula Ia.

All of the above embodiments regarding the hole transport polymer having Formula I apply equally well to a in the monomer having Formula Ia.

All of the above embodiments for $R^1$ regarding the hole transport polymer having Formula I apply equally well to $R^1$ in the monomer having Formula Ia.

All of the above embodiments for b regarding the hole transport polymer having Formula I apply equally well to b in the monomer having Formula Ia.

All of the above embodiments for $R^2$ regarding the hole transport polymer having Formula I apply equally well to $R^2$ in the monomer having Formula Ia.

Any of the above embodiments for Formula Ia can be combined with one or more of the other embodiments, so long as they are not mutually exclusive. For example, the embodiment in which $Ar^1$=$Ar^4$ can be combined with the embodiment in which $R^1$=D. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula Ia are shown below.

Monomer Ia

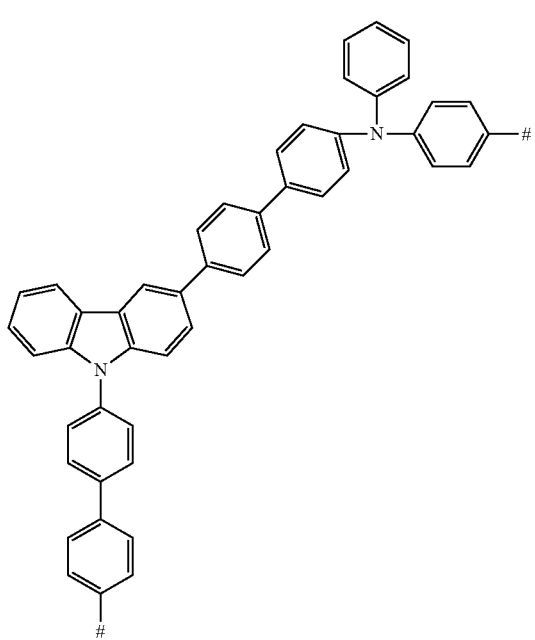

Monomer 1b

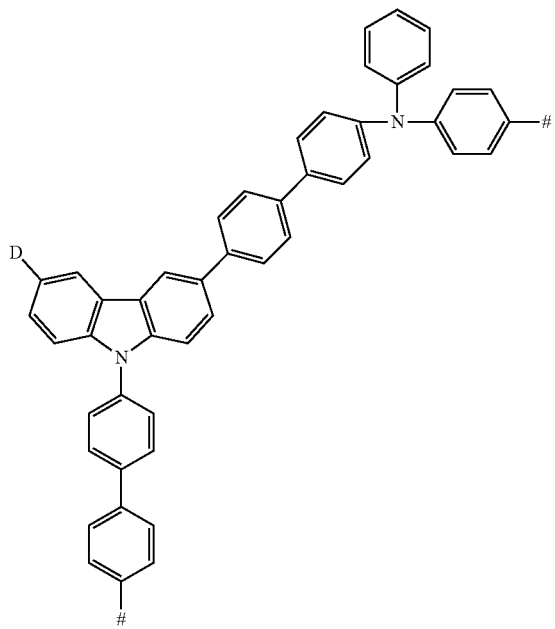

Monomer Ic

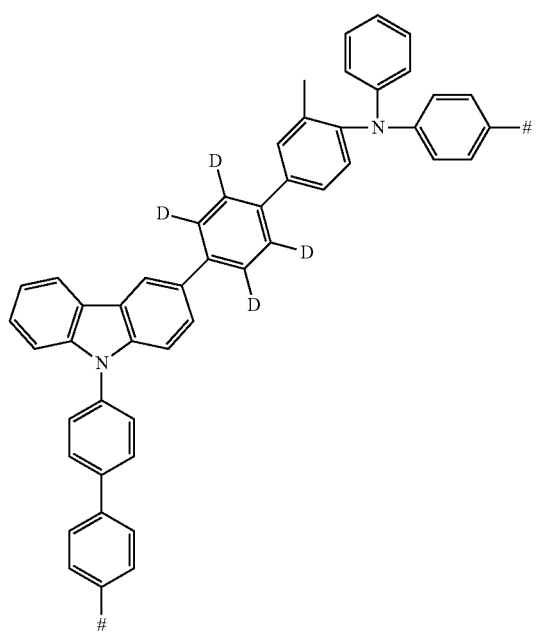

-continued

Monomer Id

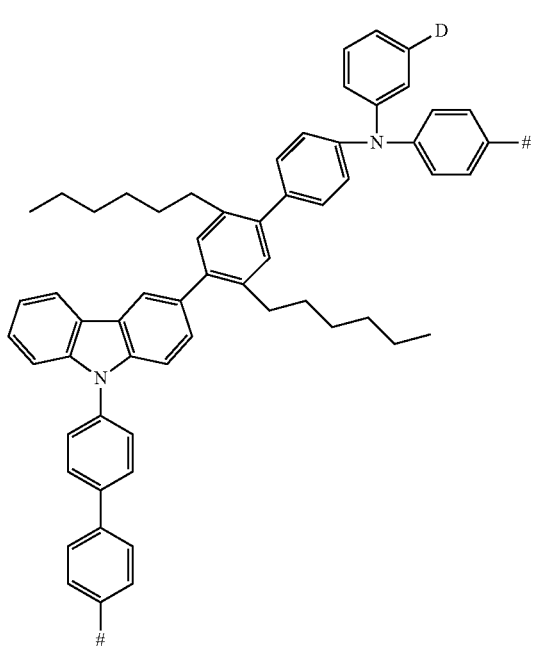

Monomer Ie

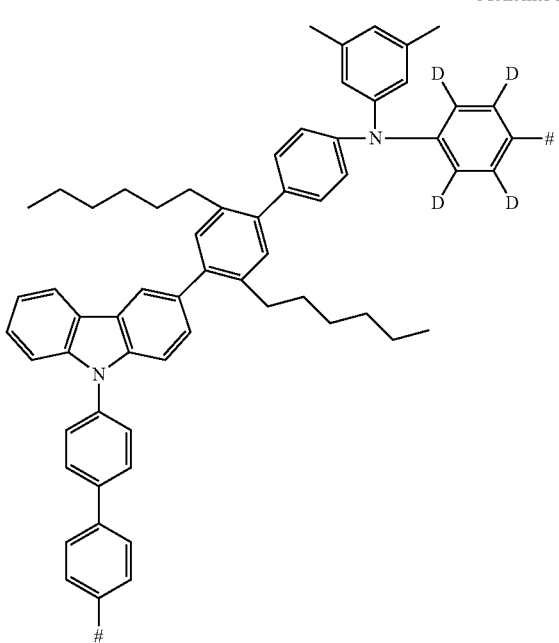

2c. Hole Transport Polymer Having Formula II

The hole transport polymer having a carbazole group and an amino nitrogen described herein has Formula II Formula II

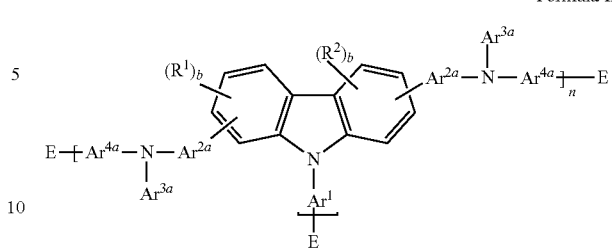

wherein:
$Ar^1$, $Ar^2$, $Ar^{2a}$, $Ar^4$, and $Ar^{4a}$ are the same or different and are substituted or unsubstituted aryl groups or deuterated aryl groups;

$Ar^3$ and $Ar^{3a}$ are substituted or unsubstituted aryl groups or deuterated aryl groups;

E is the same or different at each occurrence and is selected from the group consisting of H, D, halide, alkyl, aryl, siloxane, ester, deuterated alkyl, deuterated aryl, deuterated siloxane, deuterated ester, and a crosslinking group;

$R^1$-$R^2$ are the same or different at each occurrence and are selected from the group consisting of D, F, CN, alkyl, fluoroalkyl, aryl, heteroaryl, amino, silyl, germyl, alkoxy, ester, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated ester, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;

b is an integer from 0-3; and
n is an integer greater than or equal to 1.

As used herein, the term "hole transport polymer having a carbazole group and an amino nitrogen having Formula II" is intended to designate a polymer based on a repeat unit, or monomer, as defined by Formula II. Polymerization sites are the aryl halide groups attached to the nitrogen centers (amine and carbazole) within each monomer. This class of materials leads to monomers of ABC type and generates polymeric hole transport films with a random distribution of AAA, BBB, CCC, and mixed segments throughout the polymer. This can result in differential degrees of non-associative packing that ultimately determines the associated film-forming properties. In some embodiments, the distribution of monomeric segments can be manipulated so as to optimize properties of compounds having Formula II for use in electronic devices.

In some embodiments, the compound having Formula II is deuterated. The term "deuterated" is intended to mean that at least one H has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level. In some embodiments, the compound is at least 10% deuterated. By "% deuterated" or "% deuteration" is meant the ratio of deuterons to the sum of protons plus deuterons, expressed as a percentage. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Deuterated materials can be less susceptible to degradation by holes, electrons, excitons, or a combination thereof. Deuteration can potentially inhibit degradation of the compound during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

All of the above embodiments for $Ar^1$-$Ar^4$ regarding the hole transport polymer having Formula I apply equally well to $Ar^1$-$Ar^4$ in the hole transport polymer having Formula II.

All of the above embodiments for $Ar^2$ regarding the hole transport polymer having Formula I apply equally well to $Ar^{2a}$ in the hole transport polymer having Formula II.

All of the above embodiments for $Ar^3$ regarding the hole transport polymer having Formula I apply equally well to $Ar^{3a}$ in the hole transport polymer having Formula II.

All of the above embodiments for $Ar^4$ regarding the hole transport polymer having Formula I apply equally well to $Ar^{4a}$ in the hole transport polymer having Formula II.

All of the above embodiments for $R^1$ regarding the hole transport polymer having Formula I apply equally well to $R^1$ in the hole transport polymer having Formula II.

All of the above embodiments for b regarding the hole transport polymer having Formula I apply equally well to b in the hole transport polymer having Formula II.

All of the above embodiments for $R^2$ regarding the hole transport polymer having Formula I apply equally well to $R^2$ in the hole transport polymer having Formula II.

Any of the above embodiments for Formula II can be combined with one or more of the other embodiments, so long as they are not mutually exclusive. For example, the embodiment in which $Ar^1$=$Ar^4$ can be combined with the embodiment in which $R^1$=D. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula II are shown below.

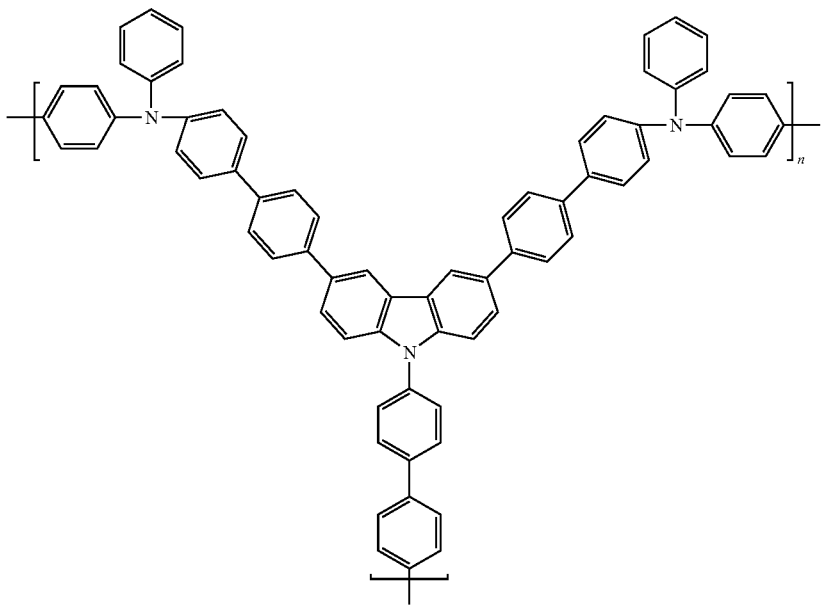

Compound HII-1

Compound HII-2
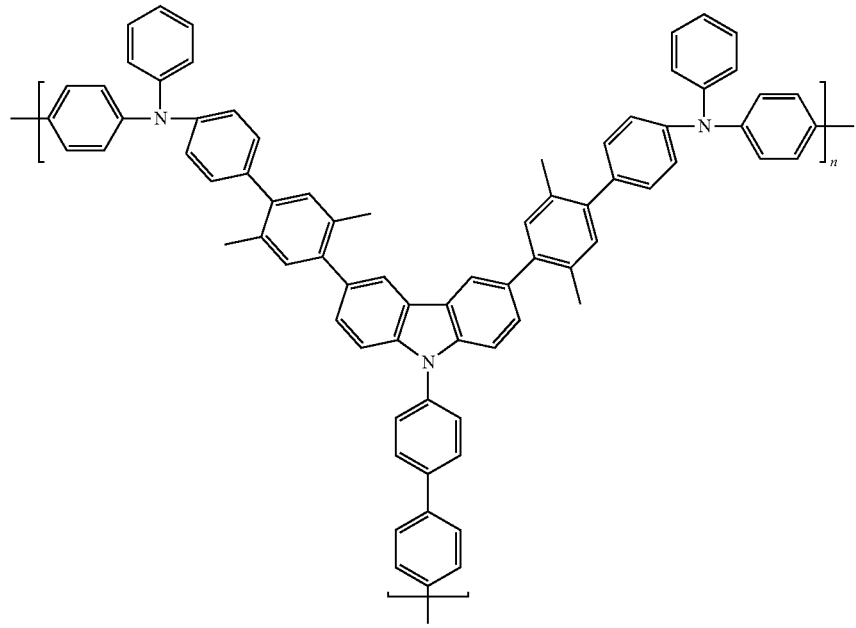
Compound HII-3
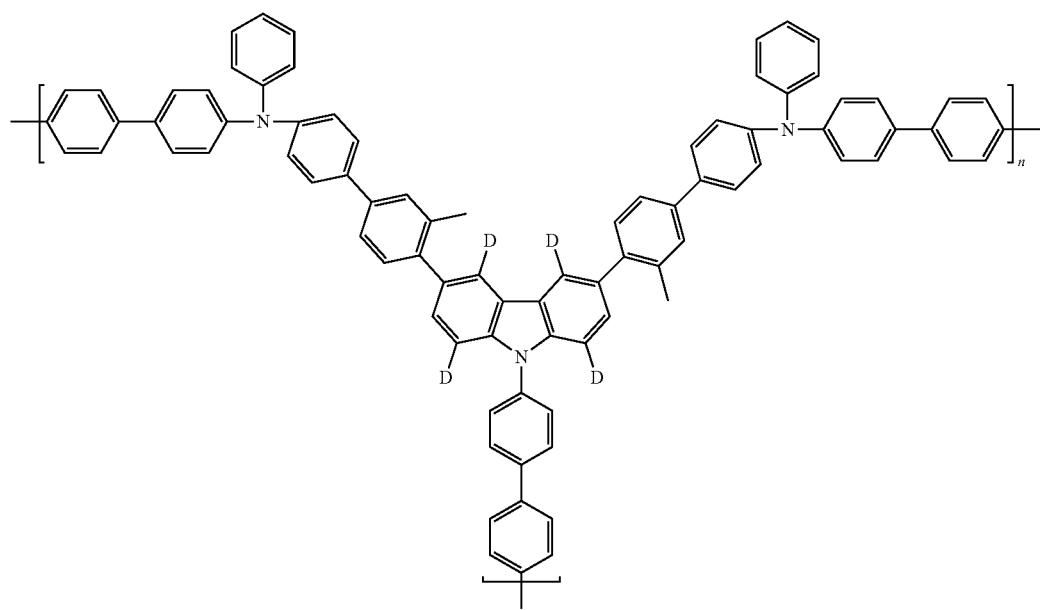

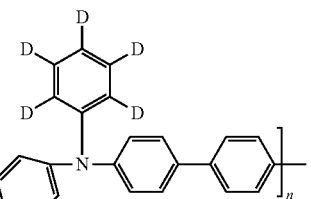

Compound HII-4

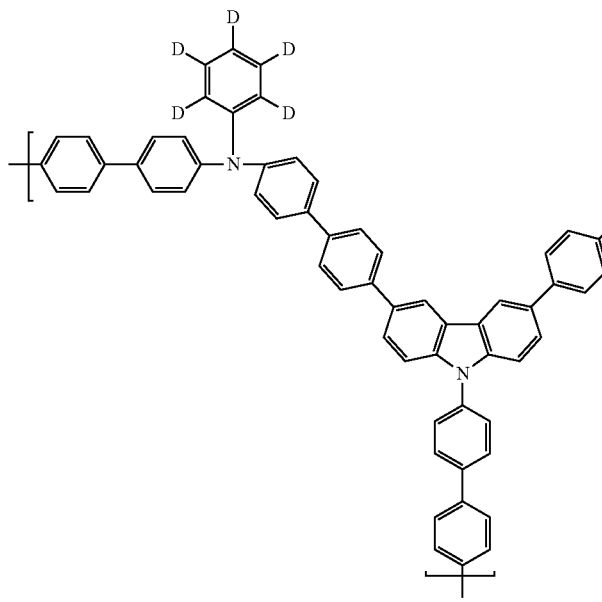

2d. Monomer Having Formula IIa

The monomer described herein has Formula IIa

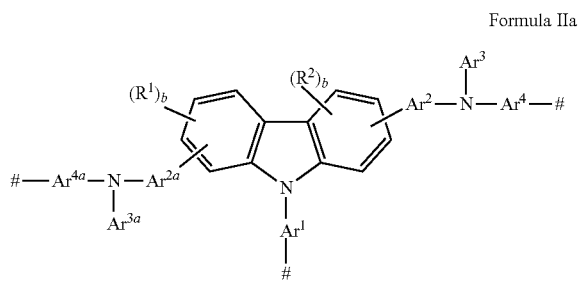

Formula IIa wherein:

$Ar^1$, $Ar^2$, $Ar^{2a}$, $Ar^4$, and $Ar^{4a}$ are the same or different and are substituted or unsubstituted aryl groups or deuterated aryl groups;

$Ar^3$ and $Ar^{3a}$ are substituted or unsubstituted aryl groups or deuterated aryl groups;

$R^1$-$R^2$ are the same or different at each occurrence and are selected from the group consisting of D, F, CN, alkyl, fluoroalkyl, aryl, heteroaryl, amino, silyl, germyl, ester, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated ester, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;

b is an integer from 0-3; and # is a point of attachment to other monomeric units.

As used herein, the term "monomer having Formula IIa" is intended to designate a polymer repeat unit, or monomer, as defined by Formula IIa. Polymerization sites are designated "#" in Formula IIa. The class of polymeric materials generated from monomers of this type produces polymeric hole transport films with a random distribution of AA, BB, and AB segments throughout the polymer. This can result in differential degrees of non-associative packing that ultimately determines the associated film-forming properties. In some embodiments, the distribution of monomeric segments can be manipulated so as to optimize properties of polymers made from monomers having Formula IIa for use in electronic devices.

In some embodiments, the monomer having Formula IIa is deuterated. The term "deuterated" is intended to mean that at least one H has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level. In some embodiments, the compound is at least 10% deuterated. By "% deuterated" or "% deuteration" is meant the ratio of deuterons to the sum of protons plus deuterons, expressed as a percentage. In some embodiments, the monomer is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Deuterated materials can be less susceptible to degradation by holes, electrons, excitons, or a combination thereof. Deuteration can potentially inhibit degradation of the compound during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

All of the above embodiments for Ar¹-Ar⁴ regarding the hole transport polymer having Formula II apply equally well to Ar¹-Ar⁴ in the monomer having Formula IIa.

All of the above embodiments for $R^1$ regarding the hole transport polymer having Formula II apply equally well to $R^1$ in the monomer having Formula IIa.

All of the above embodiments for b regarding the hole transport polymer having Formula II apply equally well to b in the monomer having Formula IIa.

All of the above embodiments for $R^2$ regarding the hole transport polymer having Formula II apply equally well to $R^2$ in the monomer having Formula IIa.

Any of the above embodiments for Formula IIa can be combined with one or more of the other embodiments, so long as they are not mutually exclusive. For example, the embodiment in which Ar¹=Ar⁴ can be combined with the embodiment in which $R^1$=D. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula IIa are shown below.

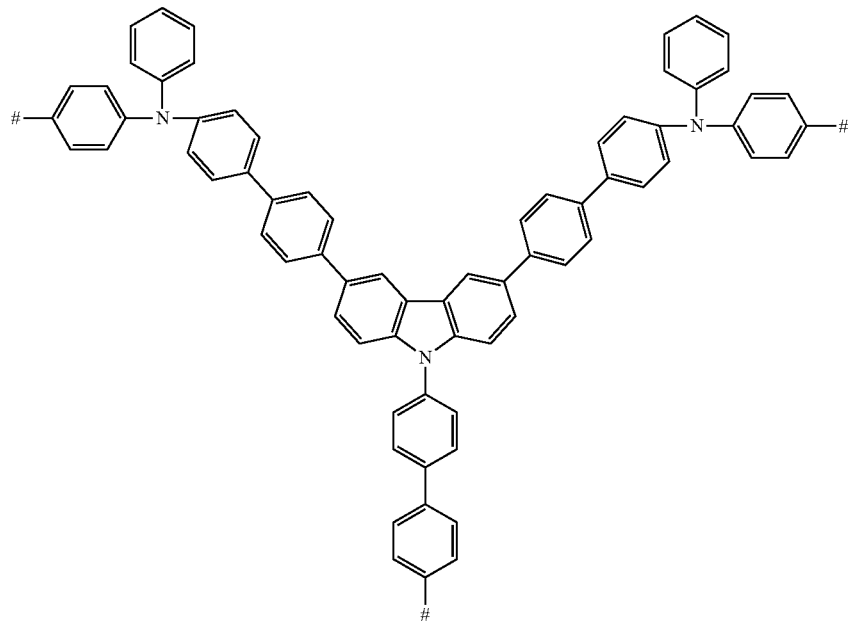

Monomer IIa

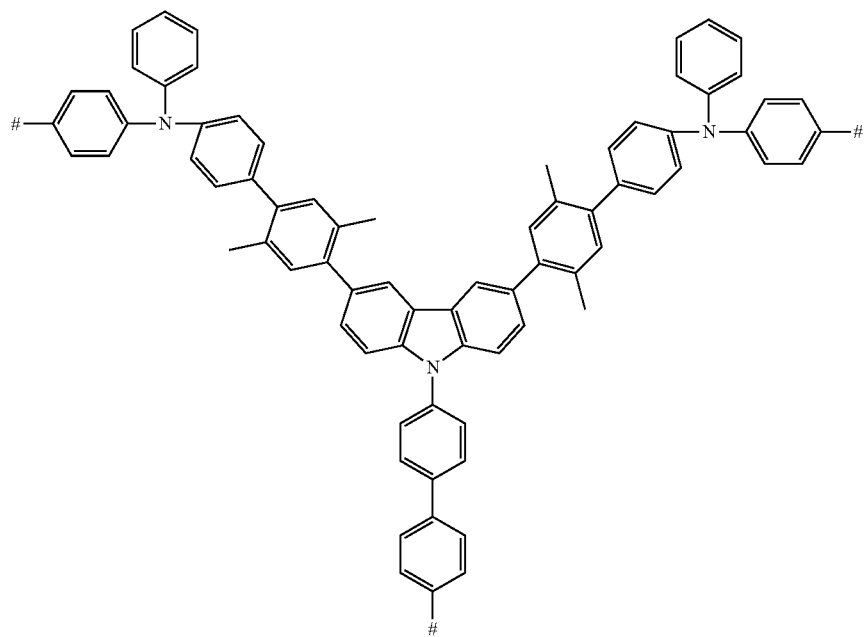

Monomer IIb

-continued

Monomer IIc

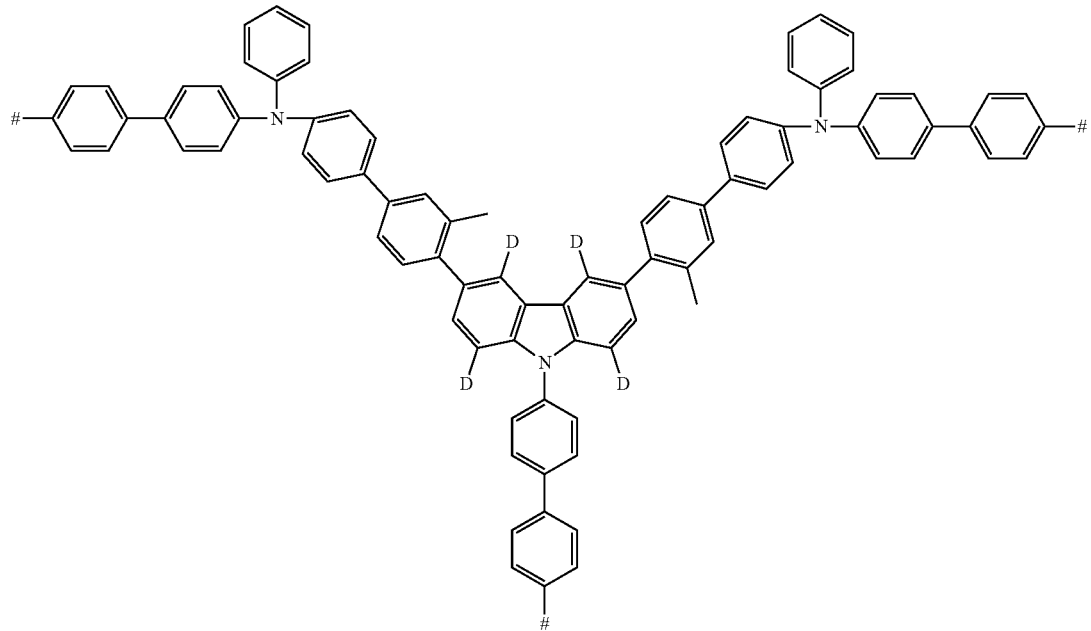

Monomer IId

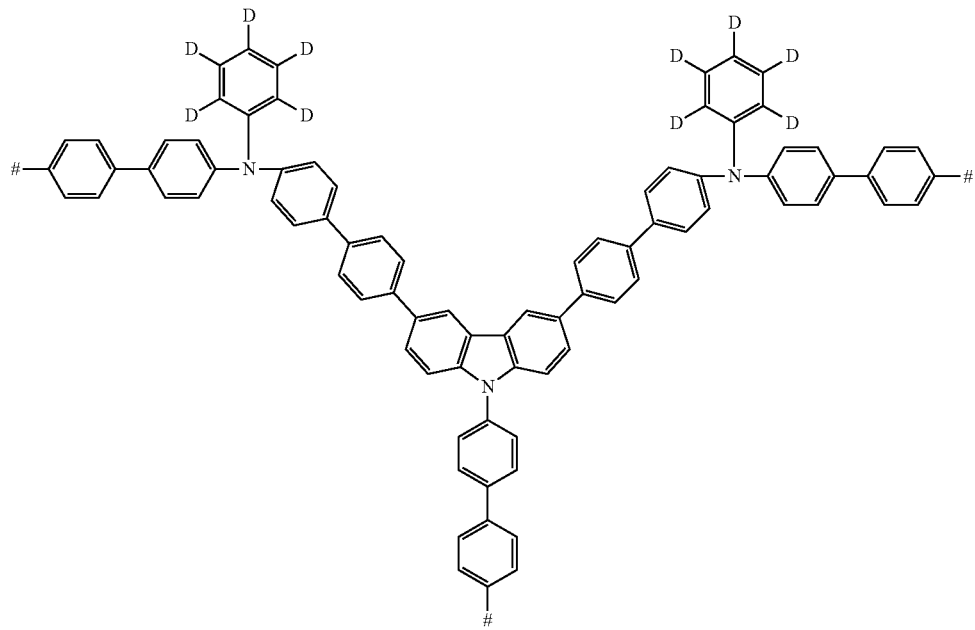

2e. Hole Transport Copolymer Having Formula III

The hole transport copolymer described herein has Formula III

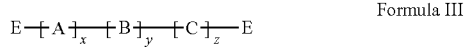

wherein:
- A is a monomeric unit having Formula Ia or Formula IIa;
- B is a monomeric unit having at least three points of attachment in the copolymer;
- C is an aromatic monomeric unit or a deuterated analog thereof;
- E is the same or different at each occurrence and is selected from the group consisting of H, D, halide, alkyl, aryl, arylamino, siloxane, ester, crosslinkable groups, deuterated alkyl, deuterated aryl, deuterated arylamino, deuterated siloxane, deuterated ester, and deuterated crosslinkable groups;
- X, y, and z are the same or different and are mole fractions, such that x+y+z=1, and x and y are non-zero.

Any of the "A", "B", or "C" monomeric units may have substituents selected from the group consisting of D, F, CN, alkyl, fluoroalkyl, aryl, heteroaryl, amino, silyl, alkoxy, aryloxy, fluoroalkoxy, siloxane, siloxy, crosslinking groups, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and deuterated crosslinking groups.

In some embodiments of Formula III, the "A", "B", and "C" units are ordered in a regular alternating pattern.

In some embodiments of Formula III, the "A", "B", and optional "C" units are ordered in blocks of like monomers.

In some embodiments of Formula III, the "A", "B", and optional "C" units are randomly arranged.

In some embodiments, the distribution of monomeric segments can be manipulated so as to optimize properties of compounds having Formula III for use in electronic devices. In some embodiments, the different distribution can result in differential degrees of non-associative packing that ultimately determines the associated film-forming properties.

In some embodiments, the copolymer having Formula III is deuterated. The term "deuterated" is intended to mean that at least one H has been replaced by deuterium ("D"). The term "deuterated analog" refers to a structural analog of a compound or group in which one or more available hydrogens have been replaced with deuterium. In a deuterated copolymer or deuterated analog, the deuterium is present in at least 100 times the natural abundance level. In some embodiments, the copolymer is at least 10% deuterated. By "% deuterated" or "% deuteration" is meant the ratio of deuterons to the sum of protons plus deuterons, expressed as a percentage. In some embodiments, the copolymer is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

The deuteration can be present on one or more of monomeric units A, B, and C. The deuteration can be present on the copolymer backbone, on pendant groups, or both.

In some embodiments of Formula III, the copolymer has a $M_n>10,000$. In some embodiments, the copolymer has a $M_n>20,000$; in some embodiments, $M_n>50,000$; in some embodiments, $M_n>100,000$; in some embodiments, $M_n>150,000$.

In some embodiments, Monomeric unit A has Formula Ia as described in section 2b above with all of the associated embodiments therein identified.

In some embodiments, Monomeric unit A has Formula IIa as described in section 2d above with all of the associated embodiments therein identified.

Monomeric unit B is a branching monomeric unit having at least three points of attachment in the copolymer.

In some embodiments, monomeric unit B is aromatic.

In some embodiments, monomeric unit B is aromatic with alkyl branching groups.

In some embodiments, monomeric unit B is aromatic with aromatic branching groups.

In some embodiments, monomeric unit B is a triarylamine group.

In some embodiments, monomeric unit B has Formula VI

(VI)

wherein:
Z is selected from the group consisting of C, Si, Ge, N, a cyclic aliphatic moiety, an aromatic moiety, a deuterated cyclic aliphatic moiety, or a deuterated aromatic moiety having at least three bonding positions;
Y is a single bond, an alkyl, an aromatic moiety, a deuterated alkyl, or a deuterated aromatic moiety, provided that when Y is a single bond, alkyl, or deuterated alkyl, A is an aromatic or deuterated aromatic moiety;
p is an integer from 3 to the maximum number of bonding positions available on Ar; and
* represents a point of attachment in the copolymer.

In some embodiments, monomeric unit B has one of Formula VII, Formula VIII, Formula IX, and Formula X

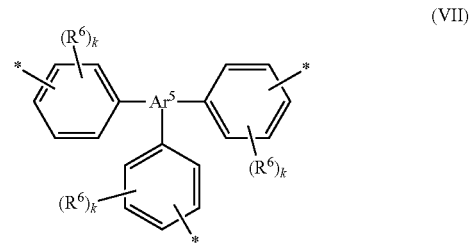

(VII)

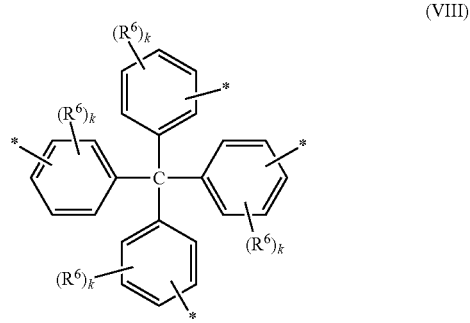

(VIII)

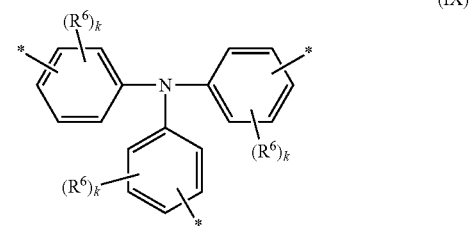

(IX)

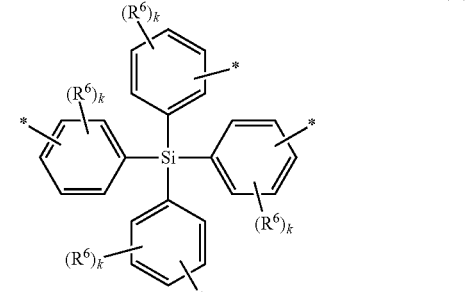

(X)

wherein:
$Ar^5$ is an aromatic moiety or a deuterated aromatic moiety having at least three bonding positions;
$R^6$ is independently the same or different at each occurrence and is selected from the group consisting of D, F, alkyl, aryl, alkoxy, ester, aryloxy, silyl, a crosslinking group, deuterated alkyl, deuterated aryl, deuterated alkoxy, deuterated ester, deuterated aryloxy, deuterated silyl, and a deuterated crosslinking group, wherein adjacent $R^6$ groups can be joined together to form a fused 5- or 6-membered aromatic ring;

k is the same or different at each occurrence and is an integer from 0 to 4;

* represents a point of attachment in the copolymer.

In some embodiments of Formula VI Z is is an aromatic moiety derived from a compound selected from benzene, naphthalene, anthracene, phenanthrene, substituted derivatives thereof, and deuterated analogs thereof.

Some non-limiting examples of monomeric unit B are shown below.

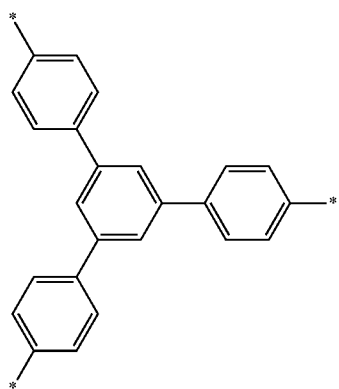

B1

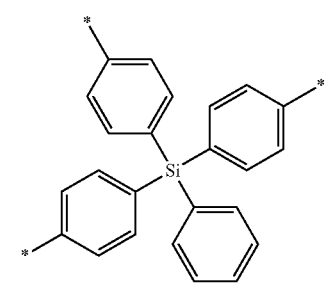

B2

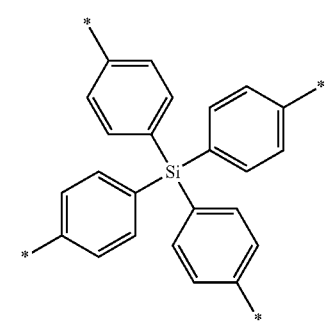

B3

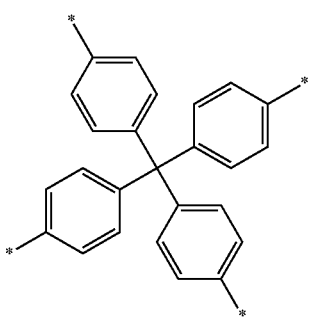

B4

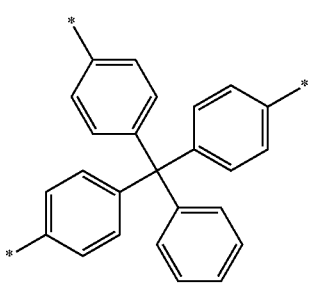

B5

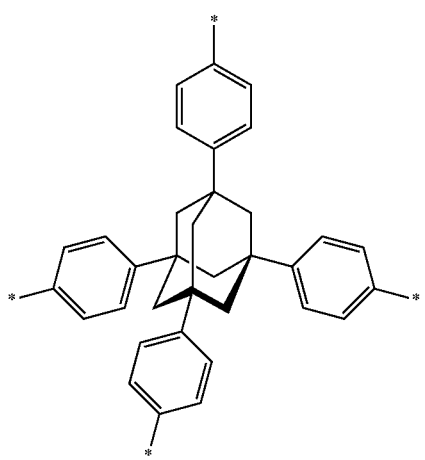

B6

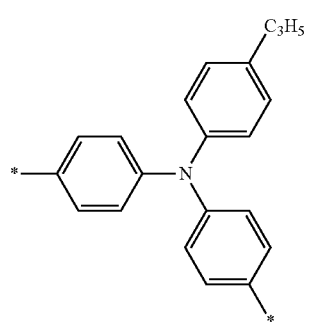

B7

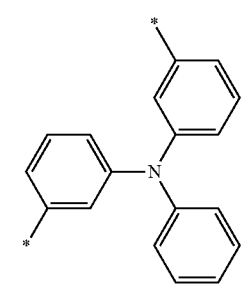

B8

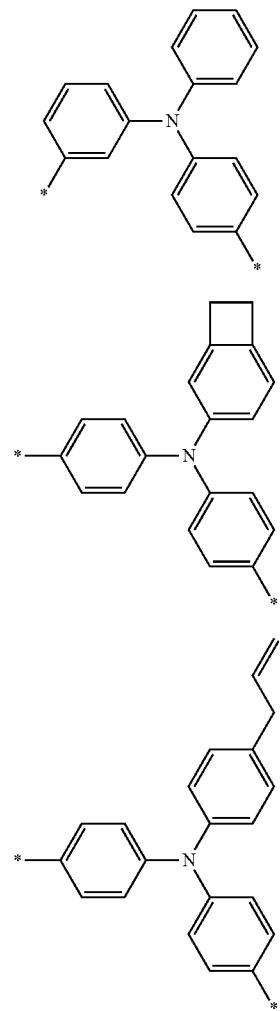
Monomeric unit C is an optional monomeric unit that is aromatic.
In some embodiments, C has one of the formulae given below.
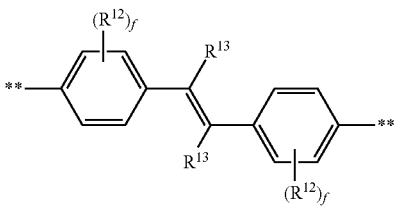
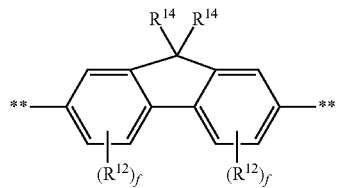
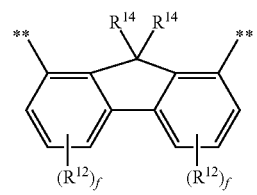
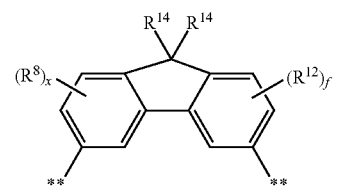
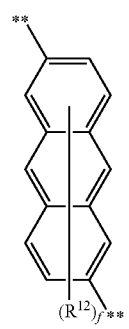
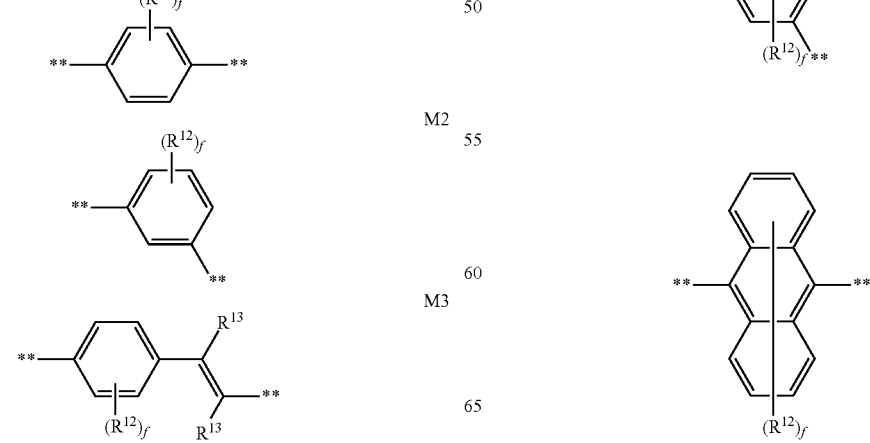

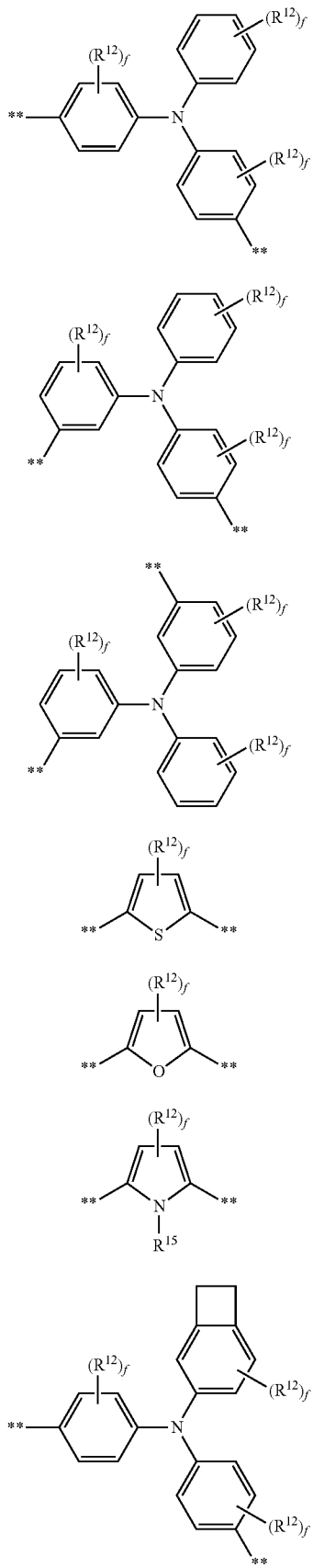
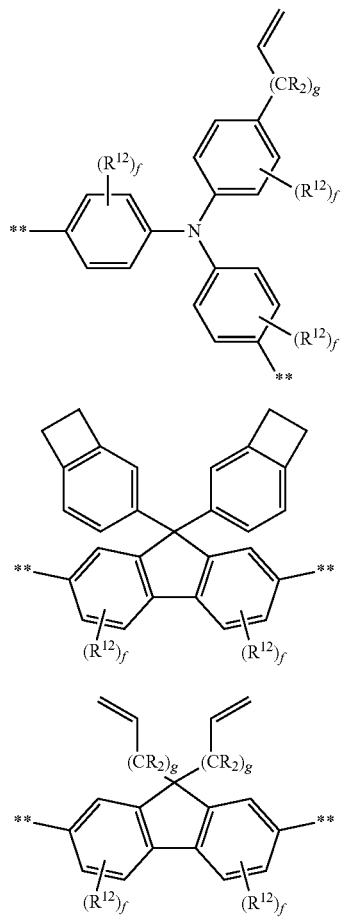

In M1 through M19:

$R^{12}$ is the same or different at each occurrence and is selected from the group consisting of D, alkyl, silyl, aryl, deuterated alkyl, deuterated silyl, and deuterated aryl;

$R^{13}$ is the same or different at each occurrence and is selected from the group consisting of H, D, alkyl, and deuterated alkyl;

$R^{14}$ is the same or different at each occurrence and is selected from the group consisting of alkyl, aryl, and deuterated analogs thereof;

$R^{15}$ is the same or different at each occurrence and is selected from the group consisting of aryl and deuterated aryl;

f is the same or different at each occurrence and is an integer from 0 to the maximum number of positions available for substituents;

g is an integer of 0-20; and

** represents the point of attachment in the copolymer.

In some embodiments of M1 through M19, f is 0-2.

Some non-limiting examples of optional monomeric unit C are shown below.

C2
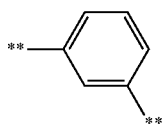

C3
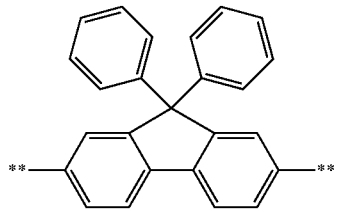

C4
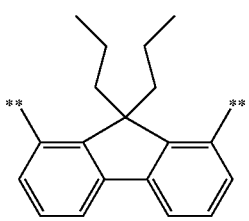

Unit E is an end-capping unit for the copolymer.

In some embodiments of Formula III, E is a crosslinking group or deuterated crosslinking group.

In some embodiments of Formula III, E is selected from aryl, ester, arylamino, crosslinkable groups, and deuterated analogs thereof.

In some embodiments of Formula III, E is selected from phenyl, biphenyl, diphenylamino, and deuterated analogs thereof.

In some embodiments of Formula III, E is H or D.

Some non-limiting examples of E are shown below.

E1
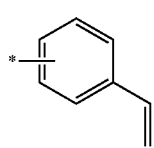

E2
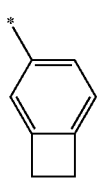

E3
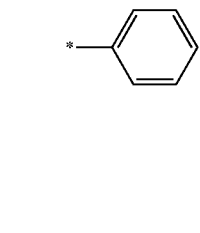

E4
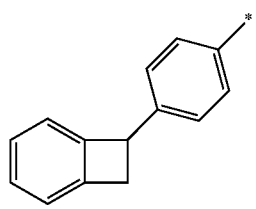

E5
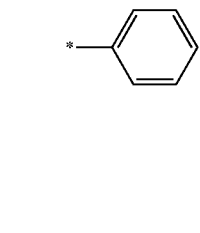

E6
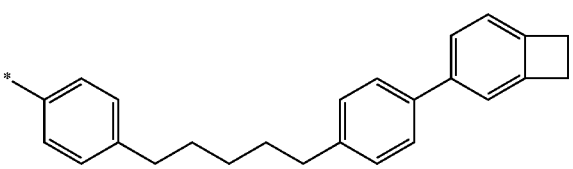

E7
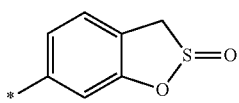

In some embodiments of Formula III, x≥0.50.

In some embodiments of Formula III, y≥0.05; in some embodiments b≥0.10.

In some embodiments of Formula III, z=0.

In some embodiments of Formula III, z=0.01-0.05.

In some embodiments of Formula I, the molar ratio of A+B to E is in the range of 50:50 to 90:10; in some embodiments, 60:40 to 80:20.

Any of the above embodiments for Formula III can be combined with one or more of the other embodiments, so long as they are not mutually exclusive. The skilled person would understand which embodiments were mutually exclusive and would thus readily be able to determine the combinations of embodiments that are contemplated by the present application.

Some non-limiting examples of compounds having Formula III are shown below.

Compound HIII-1

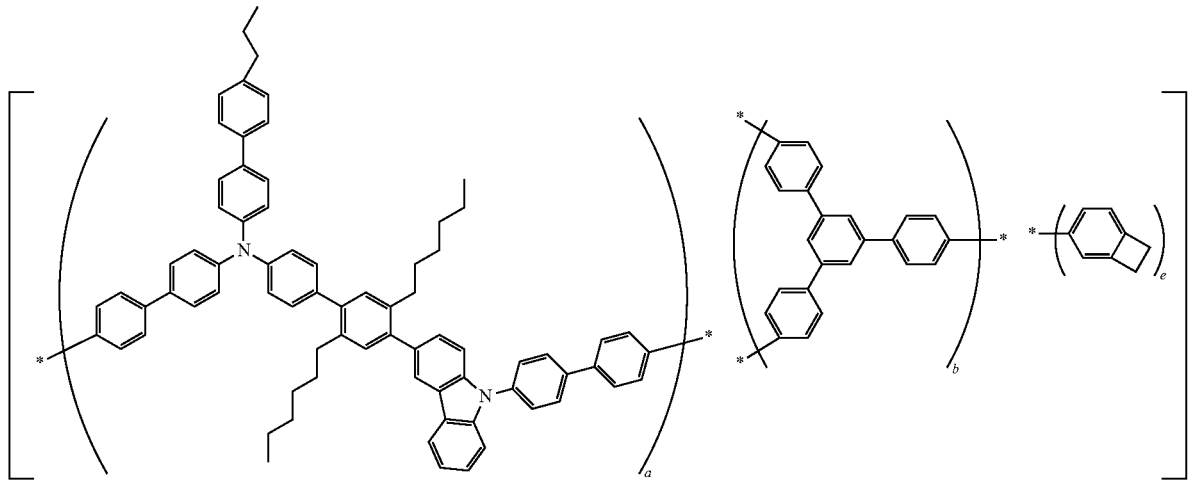

In copolymer HIII-1, the end-capping unit E is a cross-linking group. In one embodiment, the ratio of x:y:e=58:12:30.

Compound HIII-2

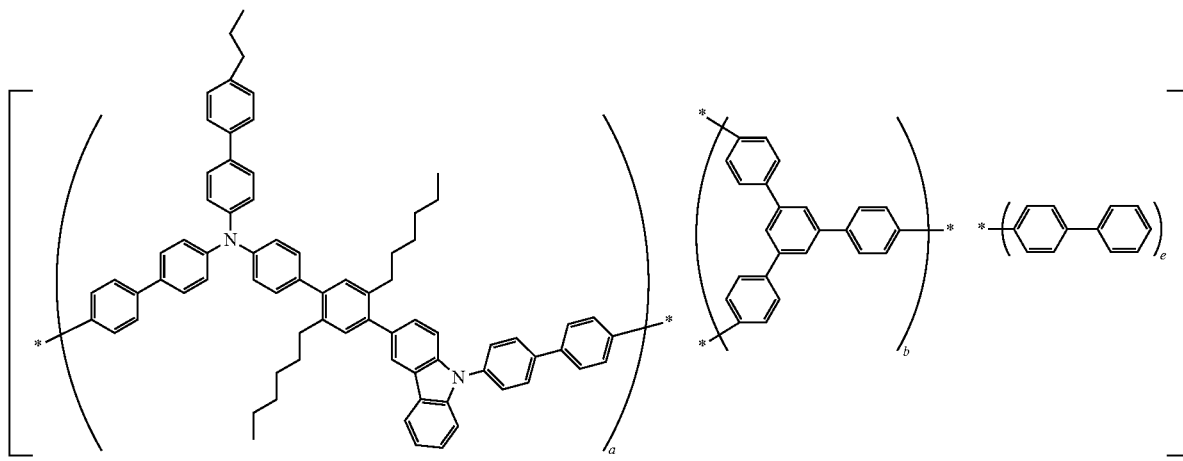

In copolymer HIII-2, the end-capping unit E is a cross-linking group. In one embodiment, the ratio of x:y:e=65:15:20.

The new monomers, polymers and copolymers can be made using any technique that will yield a C—C or C—N bond. A variety of such techniques are known, such as Suzuki, Yamamoto, Stille, and Pd— or Ni— catalyzed C—N couplings. Deuterated compounds can be prepared in a similar manner using deuterated precursor materials or, more generally, by treating the non-deuterated compound with deuterated solvent, such as d6-benzene, in the presence of a Lewis acid H/D exchange catalyst, such as aluminum trichloride or ethyl aluminum dichloride. Exemplary preparations are given in the Examples.

The compounds can be formed into layers using solution processing techniques. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The new compounds having Formula I, Formula II, and Formula III can be used as hole transport materials and as hosts for electroluminescent materials. The new compounds also have utility in one or more layers between the hole injection layer and the hole transport layer.

3. Electronic Devices

Organic electronic devices that may benefit from having one or more layers including at least one compound as described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a down-converting phosphor device); and (5) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

One illustration of an organic electronic device structure is shown in FIG. 1. The device 100 has a first electrical contact layer, an anode layer 110 and a second electrical contact layer, a cathode layer 160, and a photoactive layer 140 between them. Additional layers may optionally be present. Adjacent to the anode may be a hole injection layer 120, sometimes referred to as a buffer layer. Adjacent to the hole injection layer may be a hole transport layer 130, including hole transport material. Adjacent to the cathode may be an electron transport layer 150, including an electron transport material. As an option, devices may use one or more additional hole injection or hole transport layers (not shown) next to the anode 110 and/or one or more additional electron injection or electron transport layers (not shown) next to the cathode 160. Layers 120 through 150 are individually and collectively referred to as the organic active layers.

Figure 2:
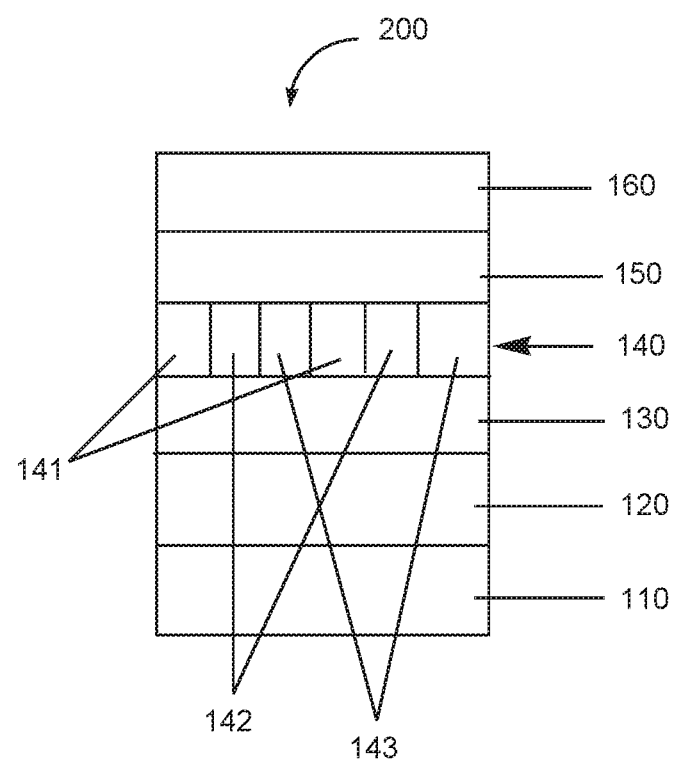
FIG. 2 includes an illustration of another example of an organic electronic device including the new hole transport polymer or copolymer described herein.

In some embodiments, in order to achieve full color, the light-emitting layer is pixellated, with subpixel units for each of the different colors. An illustration of a pixellated device is shown in FIG. 2. The device 200 has anode 110, hole injection layer 120, hole transport layer 130, electroluminescent layer 140, electron transport layer 150, and cathode 160. The electroluminescent layer is divided into subpixels 141, 142, 143, which are repeated across the layer. In some embodiments, the subpixels represent red, blue and green color emission. Although three different subpixel units are depicted in FIG. 2, two or more than three subpixel units may be used.

The different layers will be discussed further herein with reference to FIG. 1. However, the discussion applies to FIG. 2 and other configurations as well.

In some embodiments, the different layers have the following range of thicknesses: anode 110, 500-5000 Å, in some embodiments, 1000-2000 Å; hole injection layer 120, 50-2000 Å, in some embodiments, 200-1000 Å; hole transport layer 130, 50-3000 Å, in some embodiments, 200-2000 Å; photoactive layer 140, 10-2000 Å, in some embodiments, 100-1000 Å; electron transport layer 150, 50-2000 Å, in some embodiments, 100-1000 Å; cathode 160, 200-10000 Å, in some embodiments, 300-5000 Å. The desired ratio of layer thicknesses will depend on the exact nature of the materials used.

One or more of the new compounds having Formula I described herein may be present in one or more of the electroactive layers of a device. In some embodiments, the new compounds are useful as hole transport materials in layer 130. In some embodiments, the new compounds are useful as host materials for photoactive dopant materials in photoactive layer 140. The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material. The term "host material" is intended to mean a material to which a dopant is added. The host material may or may not have electronic characteristic(s) or the ability to emit, receive, or filter radiation. In some embodiments, the host material is present in higher concentration.

In some embodiments, an organic electronic device includes an anode, a cathode, and at least one organic active layer therebetween, where the organic active layer includes a compound of Formula I.

In some embodiments, an organic electronic device includes an anode, a cathode, and a photoactive layer therebetween, and further includes an additional organic active layer including a compound of Formula I. In some embodiments, the additional organic active layer is a hole transport layer.

The anode 110 is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also include an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

Optional hole injection layer 120 includes hole injection materials. The term "hole injection layer" or "hole injection material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxy-thiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can include charge transfer compounds, and the like, such as copper phthalocyanine and the tetrathiafulvalene-tetracyanoquinodimethane system (TTF-TCNQ). In some embodiments, the hole injection layer 120 is made from a dispersion of a conducting polymer and a colloid-forming polymeric acid. Such materials have been described in, for example, published U.S. patent applications 2004-0102577, 2004-0127637, and 2005-0205860.

Layer 130 includes hole transport material. In some embodiments, the hole transport layer includes a compound having Formula I.

In some embodiments, the hole transport layer includes only a compound having Formula I, where additional materials that would materially alter the principle of operation or the distinguishing characteristics of the layer are not present therein.

In some embodiments, layer 130 includes other hole transport materials. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N'bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis (9H-carbazol-9-yl)cyclobutane (DCZB); N,N,N',N'-tetrakis (4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine.

Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluoro-tetracyanoquinodimethane and perylene-3,4,9,10-tetracarboxylic-3,4,9,10-dianhydride.

Depending upon the application of the device, the photoactive layer 140 can be a light-emitting layer that is activated by an applied voltage (such as in a light-emitting diode or light-emitting electrochemical cell), a layer of material that absorbs light and emits light having a longer wavelength (such as in a down-converting phosphor device), or a layer of material that responds to radiant energy and generates a signal with or without an applied bias voltage (such as in a photodetector or photovoltaic device).

In some embodiments, the photoactive layer includes an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly (spirobifluorenes), polythiophenes, poly(p-phenylenes), copolymers thereof, and mixtures thereof.

In some embodiments, the photoactive layer 140 includes an electroluminescent material in a host material having Formula I. In some embodiments, a second host material is also present. In some embodiments, photoactive layer 140 includes only an electroluminescent material and a host material having Formula I. In some embodiments, photoactive layer 140 includes only an electroluminescent material, a first host material having Formula I, and a second host material. Examples of second host materials include, but are not limited to, chrysenes, phenanthrenes, triphenylenes, phenanthrolines, naphthalenes, anthracenes, quinolines, isoquinolines, quinoxalines, phenylpyridines, benzodifurans, and metal quinolinate complexes.

Optional layer 150 can function both to facilitate electron transport, and also serve as a hole injection layer or confinement layer to prevent quenching of the exciton at layer interfaces. Preferably, this layer promotes electron mobility and reduces exciton quenching. Examples of electron transport materials which can be used in the optional electron transport layer 150, include metal chelated oxinoid compounds, including metal quinolate derivatives such as tris (8-hydroxyquinolato)aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole) benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); triazines; fullerenes; and mixtures thereof.

In some embodiments, the electron transport material is selected from the group consisting of metal quinolates and phenanthroline derivatives. In some embodiments, the electron transport layer further includes an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

An optional electron injection layer may be deposited over the electron transport layer. Examples of electron injection materials include, but are not limited to, Li-containing organometallic compounds, LiF, $Li_2O$, Li quinolate, Cs-containing organometallic compounds, CsF, $Cs_2O$, and $Cs_2CO_3$. This layer may react with the underlying electron transport layer, the overlying cathode, or both. When an electron injection layer is present, the amount of material deposited is generally in the range of 1-100 Å, in some embodiments 1-10 Å.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. For example, there can be a layer (not shown) between the anode 110 and hole injection layer 120 to control the amount of positive charge injected and/or to provide band-gap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device layers can be formed by any deposition technique, or combinations of techniques, including vapor deposition, liquid deposition, and thermal transfer. Substrates such as glass, plastics, and metals can be used. Substrates can be flexible or non-flexible. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

For liquid deposition methods, a suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, including the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), ketones (cyclopentatone) and mixtures thereof. Suitable solvents for electroluminescent materials have been described in, for example, published PCT application WO 2007/145979.

In some embodiments, the device is fabricated by liquid deposition of the hole injection layer, the hole transport layer, and the photoactive layer, and by vapor deposition of the anode, the electron transport layer, an electron injection layer and the cathode.

It is understood that the efficiency of devices made with the new compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

In some embodiments, the device has the following structure, in order: anode, hole injection layer, hole transport layer, photoactive layer, electron transport layer, electron injection layer, cathode.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

Synthesis Example 1
This example illustrates the synthesis of polymer H1.
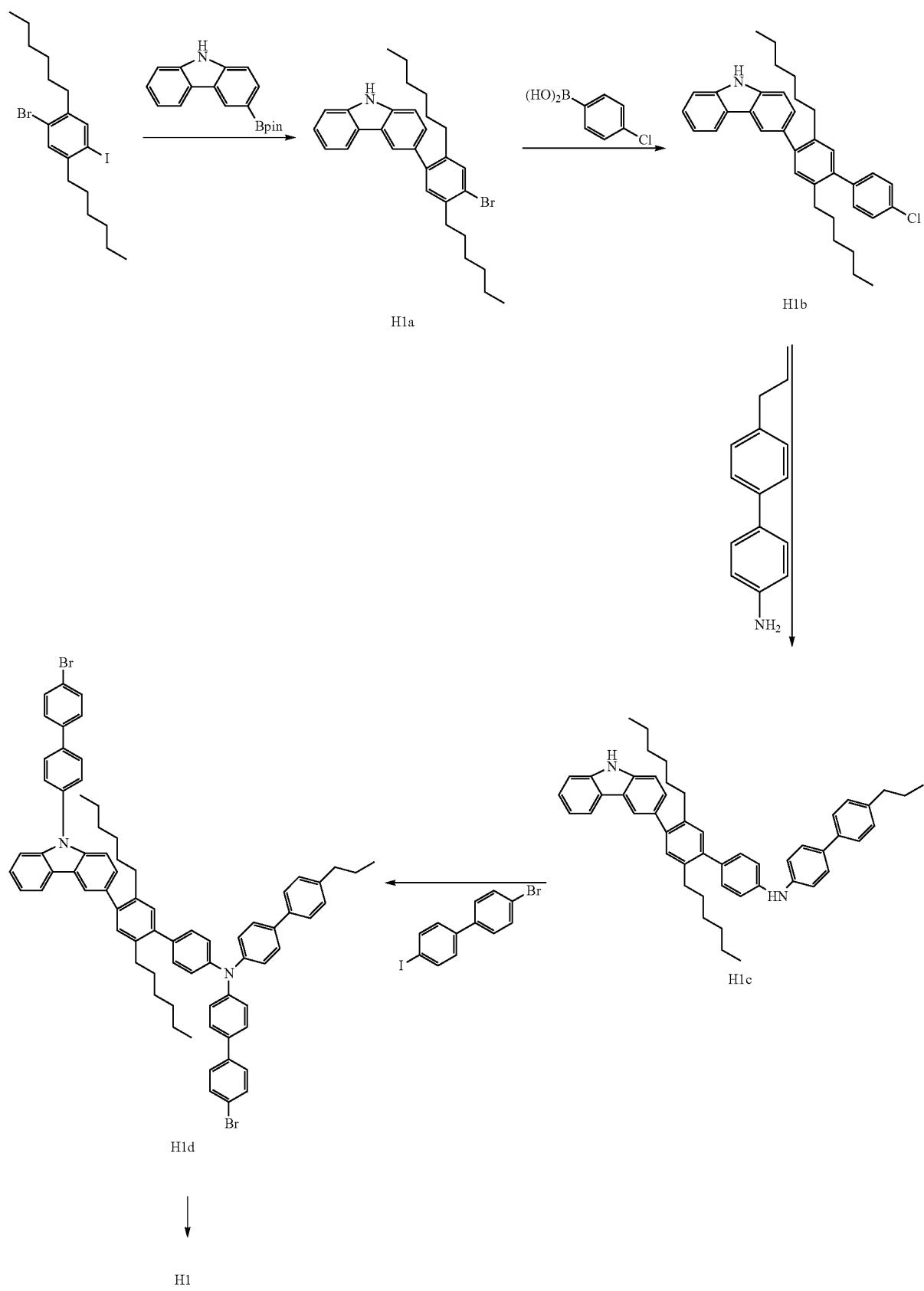

Synthesis of Compound H1a:

To a three neck 1 L flask was added 1-bromo-2,5-dihexyl-4-iodobenzene (4.00 g, 8.86 mmmol), 3-(4,4,5,5-tetramethyl-1,3,2-dioxaborolan-2-yl)-9H-carbazole (2.73 g, 9.31 mmol), sodium carbonate (2.82 g, 26 mmol), and 50 mL of o-xylene:water (1:1). The solution was degassed by bubbling nitrogen through it for 15 minutes.

Tetrakis(triphenylphosphine)Pd(0) (0.41 g, 0.355 mmol) was added and the solution was further degassed for 5 min. The reaction was heated to 120° C. for 24 hrs. Once the reaction was cooled to room temperature the organic and aqueous portions of the reaction mixture were separated and the organic was concentrated and purified using silica chromatography (hexane). The product was isolated in 51% yield.

Synthesis of Compound H1b:

To a three neck 1 L flask was added H1a (2.2 g, 4.49 mmmol), 4-chlorophenylboronic acid (0.771 g, 9.31 mmol), cesium carbonate (3.65 g, 11.2 mmol), 60 mL DEM, 30 mL EtOH and 10 mL of water. The resulting solution was degassed by bubbling nitrogen through it for 15 minutes. Pd(dppf)Cl2 (0.11 g, 0.224 mmol) was added and the solution was further degassed for 5 min. The reaction was heated to 65° C. overnight. Once the reaction was cooled to room temperature, the organic and aqueous portions of the reaction mixture were separated and the organic portion was concentrated and purified using silica chromatography (hexane). The product was isolated in 68% yield.

Synthesis of compound H1c:

Under a nitrogen atmosphere a 200 mL round bottom was loaded with H1b (1.50 g, 2.87 mmol), propylbiphenylamine (0.667 g, 3.16 mmol), Pd2(dba)3 (0.132 g, 0.144 mmol), tri-tbutyl phosphine (0.058 g, 0.287 mmol) and toluene (30 mL). The mixture was stirred and sodium t-butoxide (0.304, 2.87 mmol) was added. The reaction was heated to 97° C. for 16 hours. The reaction was cooled to room temperature; water (100 mL) and toluene (100 mL) were added. The aqueous layer was separated and back extracted with an addition 100 mL of toluene. The organic layer was dried with sodium sulfate and concentrated on Celite for purification. The solution was purified via silicachromatography (dichloro-methane:hexane 0-30%) and the fractions of product were concentrated to give the desired product as a white crystalline solid in 46% yield.

Synthesis of Compound H1d:

To a 200 mL round bottom, in the glove box, was added compound H1c (0.900 g, 1.29 mmol), 4-bromo-4'iodobiphenyl (1.39 g, 3.87 mmol), Pd2(dba)3 (0.095 g, 0.10 mmol), dppf (0.115 g, 0.21 mmol) and toluene (20 mL). The mixture was stirred and sodium t-butoxide (0.372, 3.87 mmol) was added. The reaction was heated to 100° C. After 22 hours conversion to the desired product was complete. The reaction was cooled to room temperature; water (100 mL) and toluene (100 mL) were added. The aqueous layer was separated and back extracted with an addition 100 mL of toluene. The organic layer was dried with sodium sulfate and concentrated on Celite for purification. Purification was performed via flash chromatography (0-10% Hex:DCM). Once the product was isolated it was washed with EtOH to yield a white solid which was filtered. The solid was dried to produce a white crystalline solid (0.700 g, 47% yield).

Synthesis of H1:

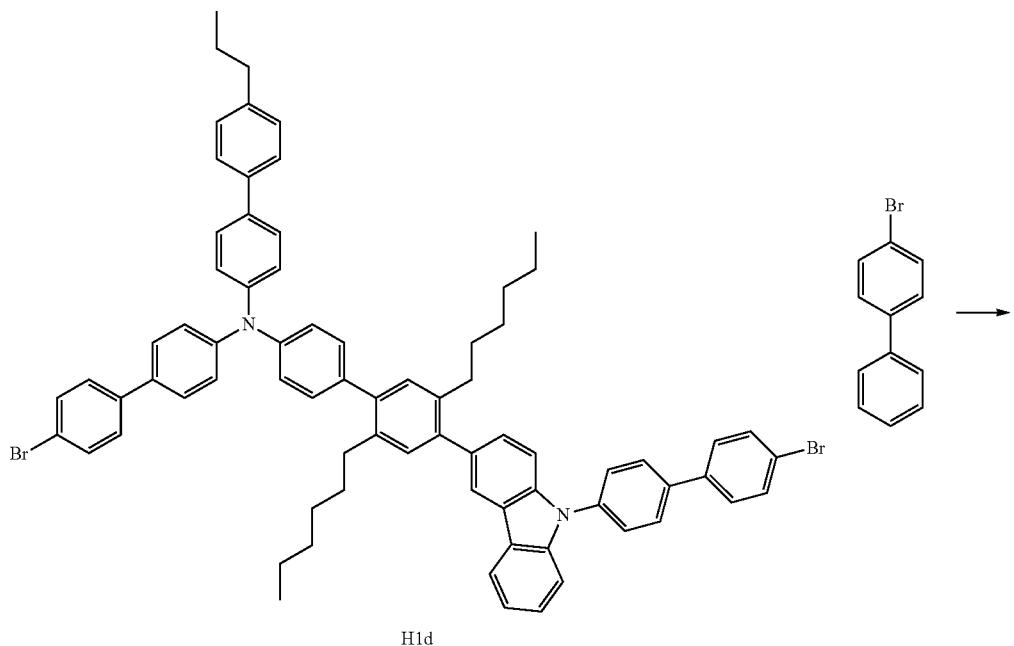

H1d

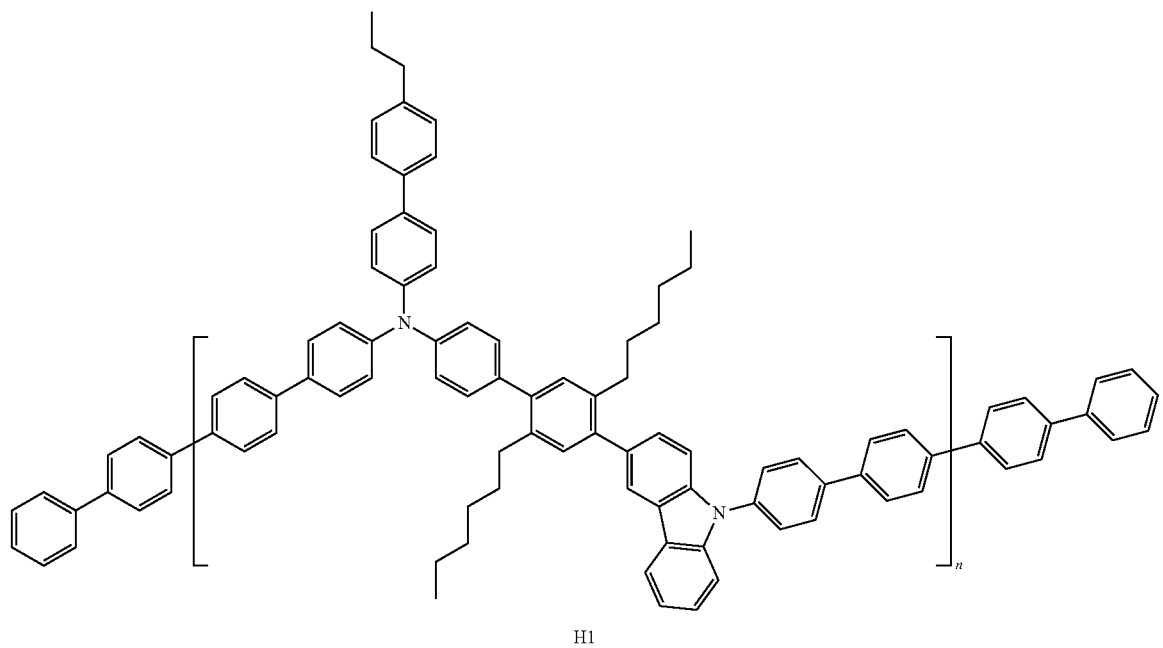

H1

Compound H1d (0.561 mmol) and 4-bromobiphenyl (0.036 mmol) were added to a scintillation vial and dissolved in 15 mL toluene. A clean, dry 50 mL Schlenk tube was charged with bis(1,5-cyclooctadiene)nickel(0) (1.21 mmol). 2,2'-Dipyridyl (1.21 mmol) and 1,5-cyclooctadiene (1.21 mmol) were weighed into a scintillation vial and dissolved in 4.0 mL N,N'-dimethylformamide. The solution was added to the Schlenk tube, which was then inserted into an aluminum block and heated to an internal temperature of 60° C. The catalyst system was held at 60° C. for 30 minutes. The monomer solution in toluene was added to the Schlenk tube and the tube was sealed. The polymerization mixture was stirred at 60° C. for three hours. The Schlenk tube was then removed from the block and allowed to cool to room temperature. The contents were poured into HCl/methanol (5% v/v, conc. HCl). After stirring for 45 minutes, the polymer was collected by vacuum filtration and dried under high vacuum. The polymer was dissolved in toluene (1% wt/v) and passed through a column containing aluminum oxide, basic. (6 gram) layered onto silica gel (6 gram). The polymer/toluene filtrate was concentrated (2.5% wt/v toluene) and triturated with 3-pentanone. The toluene/3-pentanone solution was decanted from the semi-solid polymer which was then dissolved with 15 mL toluene before being poured into stirring methanol to yield compound H1 in 50% yield. GPC analysis with polystyrene standards Mn=76,133; Mw=134,698; PDI=1.8.

Synthesis Example 2
This example illustrates the synthesis of polymer H2.
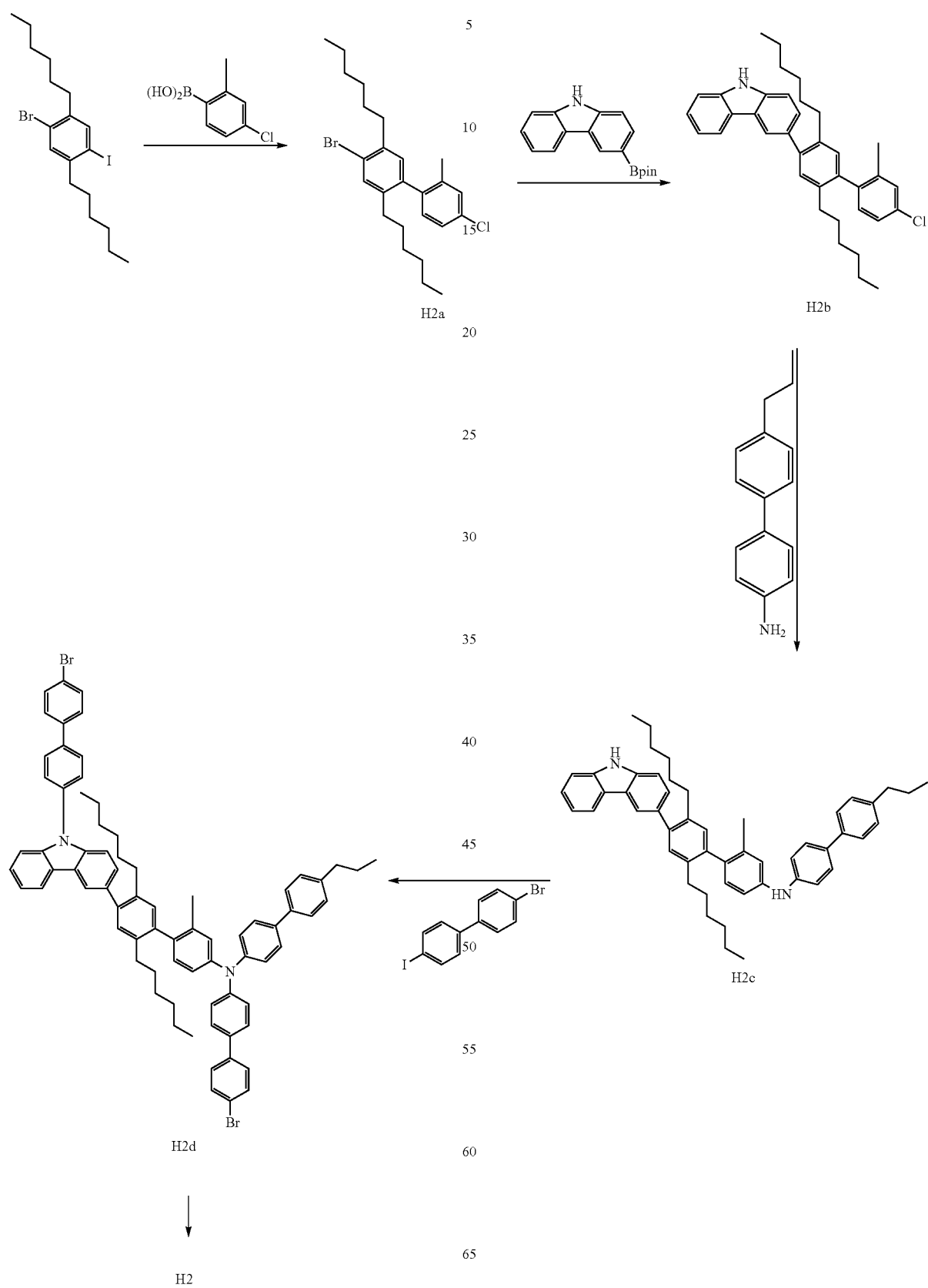

Synthesis of Compound H2a:

To a three neck 1 L flask was added 1-bromo-2,5-dihexyl-4-iodobenzene (3.00 g, 6.65 mmmol), 4-chloro-2-methylphenylboronic acid (1.07 g, 6.26 mmol), sodium carbonate (1.68 g, 26.59 mmol), and 50 mL of o-xylene:water (1:1). The solution was degassed by bubbling nitrogen through it for 15 minutes. Tetrakis(triphenylphosphine)Pd(0) (0.38 g, 0.332 mmol) was added, and the solution was further degassed for 5 min. The reaction was heated to 120° C. for 16 hrs. Once the reaction was cooled to room temperature, the organic and aqueous portions of the reaction mixture were separated and the organic portion was concentrated and purified using silica chromatography (hexane). The product was isolated in 48% yield.

Synthesis of Compound H2b:

To a three neck 1 L flask was added compound H2a (2.600 g, 5.78 mmol), 3-(4,4,5,5-tetramethyl-1,3,2-dioxaborolan-2-yl)-9H-carbazole (1.78 g, 6.07 mmol), sodium carbonate (1.84 g, 17.34 mmol), and 200 mL of m-xylene:water (1:1). The resulting solution was degassed by bubbling nitrogen through it for 15 minutes.

Tetrakis(triphenylphosphine)Pd(0) (0.267 g, 0.231 mmol) was added and the solution was further degassed for 5 min. The reaction was then stirred and heated to 100° C. for 28 hrs. The resulting material was isolated by adding 100 mL of toluene and 50 mL of H2O. The organic layer was separated and the aqueous layer was back extracted with an additional 100 mL of water. The organic layer was dried with sodium sulfate, filtered through a pad of Celite and concentrated to give 4 g of crude solid. The material was purified using silica and dicholoromethane:hexane-0-30% in as a clear oil in 44% yield.

Synthesis of Compound H2c:

Under a nitrogen atmosphere, a 200 mL round bottom flask was loaded with H2b (1.375 g, 2.56 mmol), propylbiphenylamine (0.596 g, 2.82 mmol), Pd2(dba)3 (0.117 g, 0.128 mmol), tri-tbutyl phosphine (0.0519 g, 0.256 mmol), and toluene (30 mL). The mixture was stirred and sodium t-butoxide (0.271, 2.82 mmol) was added. The reaction mixture was heated to 97° C. for 16 hours. The reaction mixture was then cooled to room temperature; water (100 mL) and toluene (100 mL) were added. The aqueous layer was separated and back extracted with an addition 100 mL of toluene. The organic layer was dried with sodium sulfate and concentrated on Celite for purification. The solution was purified via silica chromatography (dichloromethane:hexane 0-30%) and the fractions of product were concentrated to give the desired product as a white crystalline solid in 39% yield.

Synthesis of Compound H2d:

To a 200 mL round bottom, in the glove box, was added compound H2c (0.700 g, 0.984 mmol), 4-bromo-4'iodobiphenyl (1.06 g, 2.95 mmol), Pd2(dba)3 (0.072 g, 0.079 mmol), dppf (0.087 g, 0.158 mmol), and toluene (20 mL). The mixture was stirred and sodium t-butoxide (0.284, 2.95 mmol) was added. The reaction was heated to 100° C. After 22 hours conversion to the desired product was complete. The reaction was cooled to room temperature; water (100 mL) and toluene (100 mL) were added. The aqueous layer was separated and back extracted with an additional 100 mL of toluene. The organic layer was dried with sodium sulfate and concentrated on Celite for purification. Purification was performed via flash chromatography (0-10% Hex:DCM). Once the product was isolated it was washed with EtOH to yield a white solid which was filtered. The solid was dried to give a white crystalline solid (0.743 g, 64.6% yield).

Synthesis of H2:

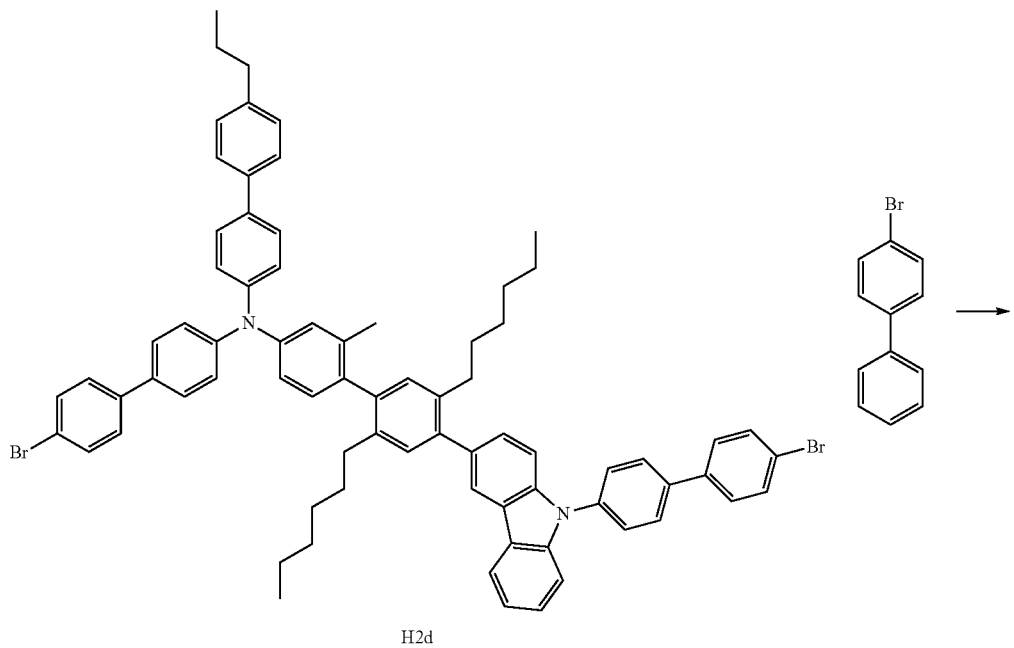

H2d

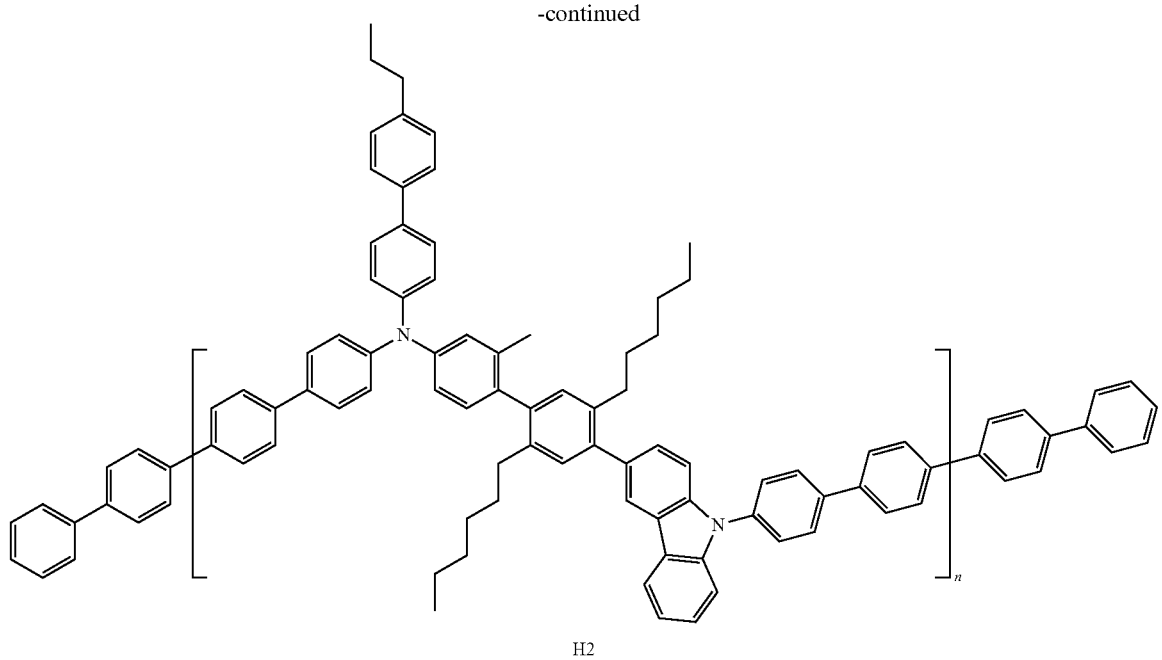

H2

H2d (0.597 mmol) and 4-bromobiphenyl (0.038 mmol) were added to a scintillation vial and dissolved in 15 mL toluene. A clean, dry 50 mL Schlenk tube was charged with bis(1,5-cyclooctadiene)nickel(0) (1.28 mmol), 2,2'-Dipyridyl (1.28 mmol), and 1,5-cyclooctadiene (1.28 mmol) were weighed into a scintillation vial and dissolved in 4.25 mL N,N'-dimethylformamide. The solution was added to the Schlenk tube, which was then inserted into an aluminum block and heated to an internal temperature of 60° C. The catalyst system was held at 60° C. for 30 minutes. The monomer solution in toluene was added to the Schlenk tube and the tube was sealed. The polymerization mixture was stirred at 60° C. for three hours. The Schlenk tube was then removed from the block and allowed to cool to room temperature. The contents were poured into HCl/methanol (5% v/v, conc. HCl). After stirring for 45 minutes, the polymer was collected by vacuum filtration and dried under high vacuum. The polymer was dissolved in toluene (1% wt/v) and passed through a column containing aluminum oxide, basic (6 gram) layered onto silica gel (6 gram). The polymer/toluene filtrate was concentrated (2.5% wt/v toluene) and triturated with 3-pentanone. The toluene/3-pentanone solution was decanted from the semi-solid polymer which was then dissolved with 16 mL toluene before being poured into stirring methanol to yield compound H2 in 59% yield. GPC analysis with polystyrene standards Mn=80,612; Mw=128,801; PDI=1.6.

Synthesis Example 3

This example illustrates the synthesis of polymer H12.
Synthesis of Monomer 12:
This monomer was synthesized as exemplified for H2c by replacing the propylbiphenylamine with biphenyl-2-amine.
Synthesis of H12:
Polymer H12 was synthesized as described for H2 to obtain polymer H12 in 50% yield. GPC analysis with polystyrene standards Mn=86,898; Mw=148,345; PDI=1.7.

DEVICE EXAMPLES (1) Materials

ET-1 is shown below.

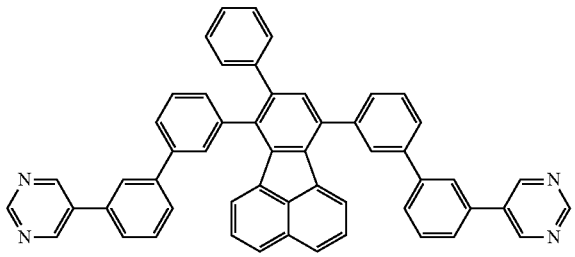 [SMILES: c1ccc(-c2cc(-c3cccc(-c4cccc(-c5cncnc5)c4)c3)c3c(c2-c2cccc(-c4cccc(-c5cncnc5)c4)c2)-c2cccc4cccc-3c24)cc1]

ET-2 is an aryl phosphine oxide.
ET-3 is lithium quinolate (LiQ).
HIJ-1 is a hole injection material which is made from an aqueous dispersion of an electrically conductive polymer and a polymeric fluorinated sulfonic acid. Such materials have been described in, for example, published U.S. patent applications US 2004/0102577, US 2004/0127637, and US 2005/0205860, and published PCT application WO 2009/018009.
HTM-1 is a triarylamine polymer. The polymer can be made using known C—C and C—N coupling techniques. Such materials have been described in, for example, published PCT Application WO2011159872.
Host H-1 is a deuterated diaryl anthracene. The compound can be made using known C—C and C—N coupling techniques. Such materials have been described in published PCT Application WO2011028216.
D-1 is a blue benzofluorene dopant. Such materials have been described, for example, in U.S. Pat. No. 8,465,848.
D-2 is a blue benzofluorene dopant. Such materials have been described, for example, in U.S. Pat. No. 8,465,848.

Hole Transport Compounds are specified in the examples device examples that follow.

(2) Device Fabrication

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Device Type 1: Immediately before device fabrication the cleaned, patterned ITO substrates were treated with UV ozone for 10 minutes. Immediately after cooling, an aqueous dispersion of hole injection material was spin-coated over the ITO surface and heated to remove solvent. After cooling, the substrates were then spin-coated with an anisole:toluene solution of hole transport material, and then heated to remove solvent. After cooling the substrates were spin-coated with a methyl benzoate solution of the host and dopant, and heated to remove solvent. The substrates were masked and placed in a vacuum chamber. A layer of electron transport material was deposited by thermal evaporation, followed by a layer of electron injection material. Masks were then changed in vacuo and a layer of Al was deposited by thermal evaporation. The chamber was vented, and the devices were encapsulated using a glass lid, dessicant, and UV curable epoxy.

Device Type 2: Immediately before device fabrication the cleaned, patterned ITO substrates were treated with UV ozone for 10 minutes. Immediately after cooling, an aqueous dispersion of hole injection material was spin-coated over the ITO surface and heated to remove solvent. After cooling, the substrates were then spin-coated with an anisole:toluene solution of hole transport material, and then heated to remove solvent. The workpieces were then placed in a vacuum chamber. Layers of the photoactive and host materials, electron transport materials, and the Al cathode were then deposited sequentially by thermal evaporation using the appropriate masks. The chamber was vented, and the devices were encapsulated using a glass lid, dessicant, and UV curable epoxy.

(3) Device Characterization

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The color coordinates were determined using either a Minolta CS-100 meter or a Photoresearch PR-705 meter.

(4) Device Examples 1, 2 and Comparative Example A

These examples demonstrates the fabrication and performance of devices including a hole transport polymer having Formula I. The devices were made as described above for Device Type 1 and had the following layers:
Anode=ITO (50 nm)
HIL=HIJ-1 (100 nm)
HTL=see table (105 nm)
EML=7 wt % D-1: 93 wt % H-1 (40 nm)
ETL=ET-1 (20 nm)
EIL=ET-3 (3 nm)
Cathode=Al (100 nm)
The results are given in Table 1 below.

TABLE 1

Device Results

| Example | Hole Transport Polymer | Voltage (V) | EQE (%) | C.E. (cd/A) | CIE (x, y) |
|---|---|---|---|---|---|
| 1 | Compound H1 | 5.9 | 7.0 | 6.0 | (0.14, 0.10) |
| 2 | Compound H2 | 6.2 | 7.0 | 6.2 | (0.14, 0.10) |
| Comparative A | HTM-1 | 5.2 | 6.6 | 5.6 | (0.14, 0.10) |

All data @ 1000 nits. Voltage measured at 15 mA/cm$^2$. E.Q.E. is the external quantum efficiency; CIE (x, y) are the x and y color coordinates according to the C.I.E. chromaticity scale (Commission Internationale de L'Eclairage, 1931).

(5) Device Examples 3, 4 and Comparative Example B

These examples demonstrates the fabrication and performance of devices including a hole transport polymer having Formula I. The devices were made as described above for Device Type 1 and had the following layers:
Anode=ITO (50 nm)
HIL=HIJ-1 (100 nm)
HTL=see table (100 nm)
EML=7 wt % D-1: 93 wt % H-1 (40 nm)
ETL=60 wt % ET-2: 40 wt % ET-3 (20 nm)
EIL=ET-3 (3 nm)
Cathode=Al (100 nm) The results are given in Table 2 below.

TABLE 2

Device Results

| Example | Hole Transport Polymer | Voltage (V) | EQE (%) | C.E. (cd/A) | CIE (x, y) |
|---|---|---|---|---|---|
| 3 | Compound H2 | 5.7 | 6.3 | 5.5 | (0.14, 0.10) |
| 4 | Compound H12 | 6.0 | 6.3 | 6.0 | (0.14, 0.11) |
| Comparative B | HTM-1 | 5.0 | 5.5 | 4.8 | (0.14, 0.10) |

All data @ 1000 nits. Voltage measured at 15 mA/cm$^2$. E.Q.E. is the external quantum efficiency; CIE (x, y) are the x and y color coordinates according to the C.I.E. chromaticity scale (Commission Internationale de L'Eclairage, 1931).

(6) Device Examples 5, 6 and Comparative Example C

These examples demonstrates the fabrication and performance of devices including a hole transport polymer having Formula I. The devices were made as described above for Device Type 2 and had the following layers:
Anode=ITO (50 nm)
HIL=HIJ-1 (100 nm)
HTL=see table (105 nm)
EML=20 wt % D-2:80 wt % H-1 (33 nm)
ETL=ET-1 (20 nm)

EIL=ET-3 (3 nm)
Cathode=Al (100 nm)
The results are given in Table 3 below.

TABLE 3

| Example | Hole Transport Polymer | Voltage (V) | EQE (%) | C.E. (cd/A) | CIE (x, y) |
|---|---|---|---|---|---|
| 5 | Compound H1 | 4.7 | 9.6 | 8.4 | (0.14, 0.10) |
| 6 | Compound H2 | 5.1 | 9.9 | 8.8 | (0.14, 0.10) |
| Comparative C | HTM-1 | 4.2 | 8.9 | 8.0 | (0.14, 0.10) |

All data @ 1000 nits. Voltage measured at 15 mA/cm$^2$. E.Q.E. is the external quantum efficiency; CIE (x, y) are the x and y color coordinates according to the C.I.E. chromaticity scale (Commission Internationale de L'Eclairage, 1931.

(7) Device Example 7 and Comparative Example D

These examples demonstrates the fabrication and performance of devices including a hole transport polymer having Formula I. The devices were made as described above for Device Type 2 and had the following layers:

Anode=ITO (50 nm)
HIL=HIJ-1 (60 nm)
HTL=see table (20 nm)
EML=7 wt % D-2: 93 wt % H-1 (20 nm)
ETL=60 wt % ET-2: 40 wt % ET-3 (20 nm)
EIL=ET-3 (3 nm)
Cathode=Al (100 nm)
The results are given in Table 4 below.

TABLE 4

| Example | Hole Transport Polymer | Voltage (V) | EQE (%) | C.E. (cd/A) | CIE (x, y) |
|---|---|---|---|---|---|
| 7 | Compound H12 | 4.2 | 9.7 | 10.7 | (0.14, 0.14) |
| Comparative D | HTM-1 | 4.0 | 8.5 | 9.1 | (0.14, 0.13) |

All data @ 1000 nits. Voltage measured at 15 mA/cm$^2$. E.Q.E. is the external quantum efficiency; CIE (x, y) are the x and y color coordinates according to the C.I.E. chromaticity scale (Commission Internationale de L'Eclairage, 1931.

(8) Device Example 8, 9 and Comparative Example E

These examples demonstrates the fabrication and performance of devices including a hole transport polymer having Formula I. The devices were made as described above for Device Type 2 and had the following layers:

Anode=ITO (50 nm)
HIL=HIJ-1 (60 nm)
HTL=see table (19 nm)
EML=7 wt % D-2: 93 wt % H-1 (20 nm)
ETL=60 wt % ET-2: 40 wt % ET-3 (20 nm)
EIL=ET-3 (3.8 nm)
Cathode=Al (100 nm)
The results are given in Table 5 below.

TABLE 5

| Example | Hole Transport Polymer | Voltage (V) | EQE (%) | C.E. (cd/A) | CIE (x, y) |
|---|---|---|---|---|---|
| 8 | Compound H1 | 4.3 | 9.6 | 10.3 | (0.138, 0.130) |
| 9 | Compound H2 | 4.3 | 10.1 | 10.2 | (0.139, 0.120) |
| Comparative E | HTM-1 | 4.2 | 8.4 | 8.6 | (0.139, 0.121) |

All data @ 1000 nits. Voltage measured at 15 mA/cm$^2$. E.Q.E. is the external quantum efficiency; CIE (x, y) are the x and y color coordinates according to the C.I.E. chromaticity scale (Commission Internationale de L'Eclairage, 1931.

Described herein is a hole transport polymer having a carbazole group and an amino nitrogen, wherein said polymer has Formula I.

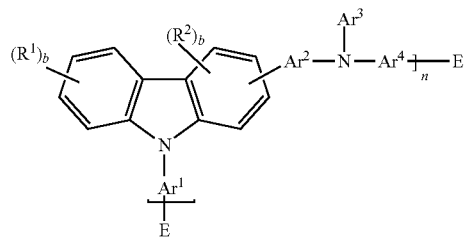

Formula I

In Formula I; $Ar^1$, $Ar^2$, and $Ar^4$ are the same or different and are substituted or unsubstituted aryl groups or deuterated aryl groups, and $Ar^3$ is substituted or unsubstituted aryl groups or deuterated aryl groups. Further, E is the same or different at each occurrence and is selected from the group consisting of H, D, halide, alkyl, aryl, siloxane, ester, deuterated alkyl, deuterated aryl, deuterated siloxane, deuterated ester, and a crosslinking group. Also, $R^1$-$R^2$ are the same or different at each occurrence and are selected from the group consisting of D, F, CN, alkyl, fluoroalkyl, aryl, heteroaryl, amino, silyl, alkoxy, ester, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated ester, deuterated aryloxy, deuterated fluoroalkoxy, deuterated siloxane, deuterated siloxy, and crosslinking groups, wherein adjacent groups selected from $R^1$ and $R^2$ can be joined together to form a fused ring. Finally; a is an integer from 0-4, b is an integer from 0-3, and n is an integer greater than or equal to 1.

In some embodiments of Formula I, $Ar^1$-$Ar^4$ are aryl groups having no fused rings. There are also embodiments of Formula I wherein one or both of $Ar^1$ and $Ar^4$ has Formula a:

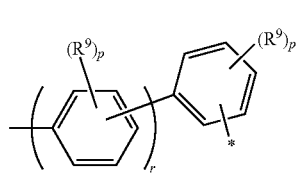

Formula a

Here; $R^9$ is the same or different at each occurrence and is selected from the group consisting of D, alkyl, alkoxy, siloxane ester, and silyl, wherein adjacent $R^9$ groups can be joined together to form a fused ring. Also; p is the same or different at each occurrence and is an integer from 0-4, r is an integer from 1 to 5, and* indicates the point of attachment to E.

In some embodiments of the hole transport with Formula I; $Ar^1$ and $Ar^4$ are selected from the group consisting of phenyl, biphenyl, terphenyl, deuterated analogs thereof, and derivatives thereof having one or more substituents selected from the group consisting of fluoro, alkyl, alkoxy, silyl, siloxy, a substituent with a crosslinking group, and deuterated analogs thereof.

In some embodiments of the hole transport polymer with Formula I, $Ar^2$ has Formula a'

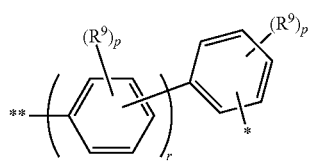

Formula a'

Here; $R^9$ is the same or different at each occurrence and is selected from the group consisting of D, alkyl, alkoxy, ester, siloxane, silyl, deuterated alkyl, deuterated alkoxy, deuterated siloxane, deuterated silyl, wherein adjacent $R^9$ groups can be joined together to form a fused ring. Also; p is the same or different at each occurrence and is an integer from 0-4, r is an integer from 1 to 5, * indicates the point of attachment to the amino-nitrogen atom, and ** indicates the point of attachment to the carbazole group.

In some embodiments of the hole transport polymer with Formula I; $Ar^2$ is selected from the group consisting of 1-naphthyl, 2-naphthyl, anthracenyl, fluorenyl, deuterated analogs thereof, and derivatives thereof having one or more substituents selected from the group consisting of fluoro, alkyl, alkoxy, silyl, siloxy, a substituent with a crosslinking group, and deuterated analogs thereof.

In some embodiments of the hole transport polymer with Formula I, $Ar^3$ has Formula d

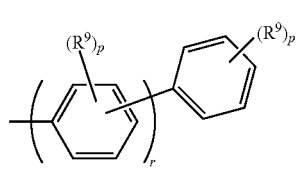

Formula d

Here; $R^9$ is the same or different at each occurrence and is selected from the group consisting of D, alkyl, alkoxy, siloxane, silyl, ester, deuterated alkyl, deuterated alkoxy, deuterated siloxane, deuterated ester, and deuterated silyl, wherein adjacent $R^9$ groups can be joined together to form a fused ring. Also; p is the same or different at each occurrence and is an integer from 0-4, q is an integer from 0-5, and r is an integer from 1 to 5. $R^9$ may also be an alkyl or deuterated alkyl group with p=0, and q=r=1.

In some embodiments of the hole transport polymer with Formula I, a>0 and $R^1$ is D or $C_{1-10}$ alkyl. The $C_{1-10}$ alkyl group may also be deuterated. Alternatively, a>0 and R1 is D or $C_{6-20}$ aryl, and this aryl group may be deuterated.

In some embodiments of the hole transport polymer with Formula I, n>5. Some specific embodiments of the hole transport polymer with Formula I are

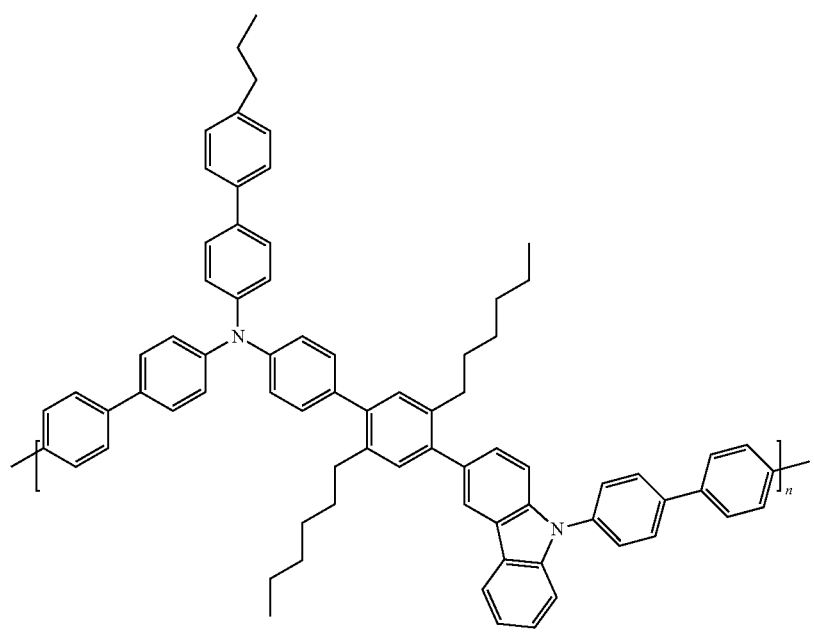

Compound H1

-continued
Compound H2
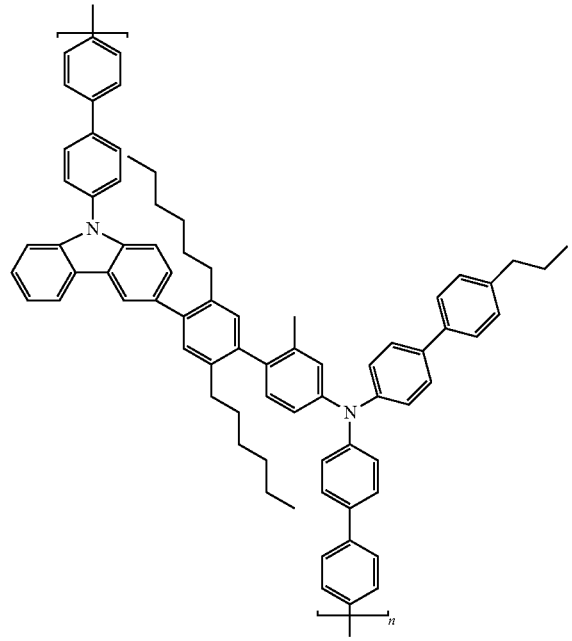
Compound H3
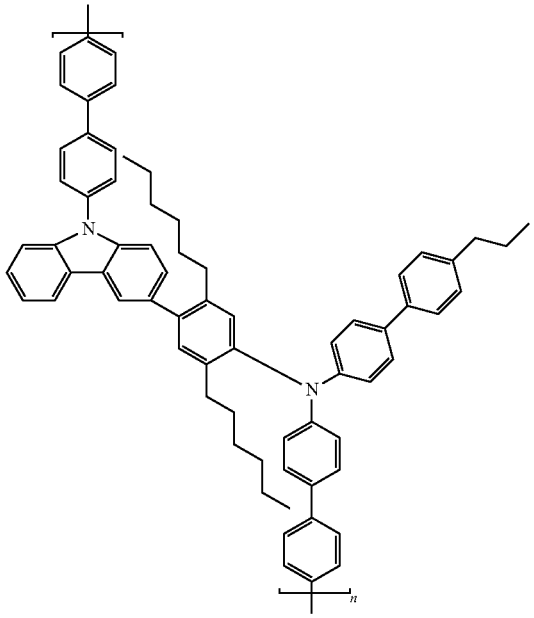
Compound H4
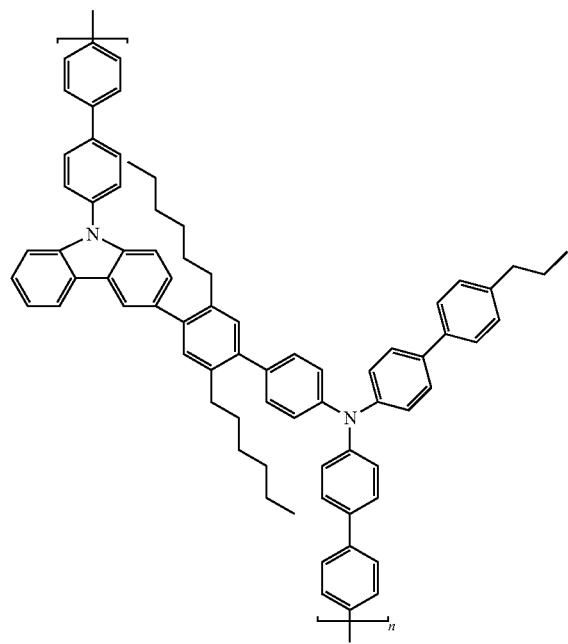
Compound H5
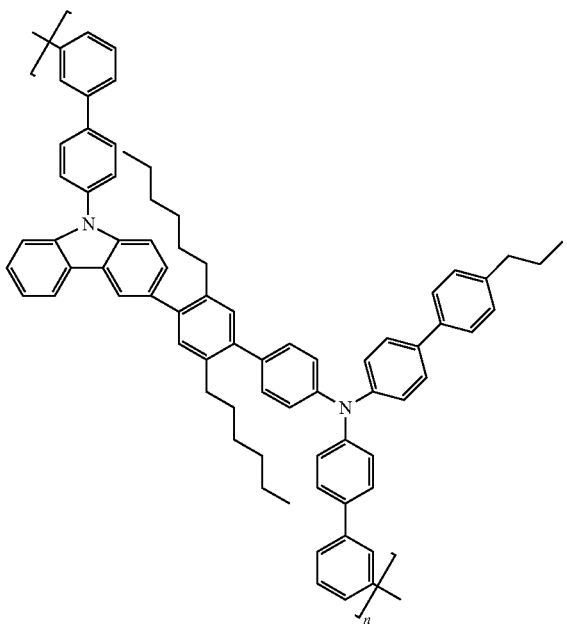

Compound H6
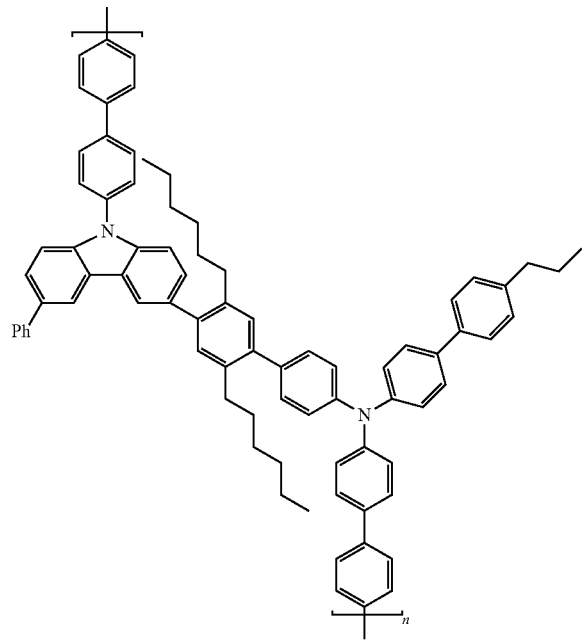
Compound H7
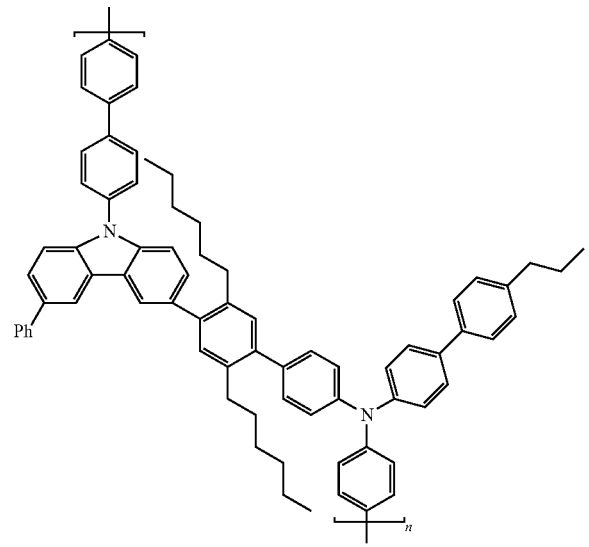
Compound H8
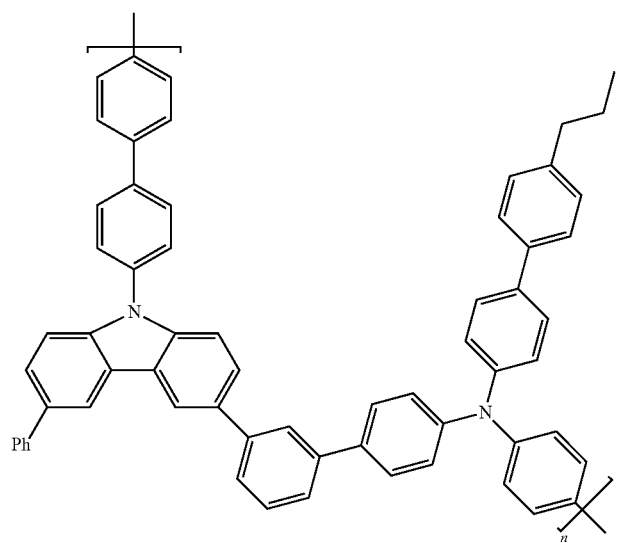

-continued

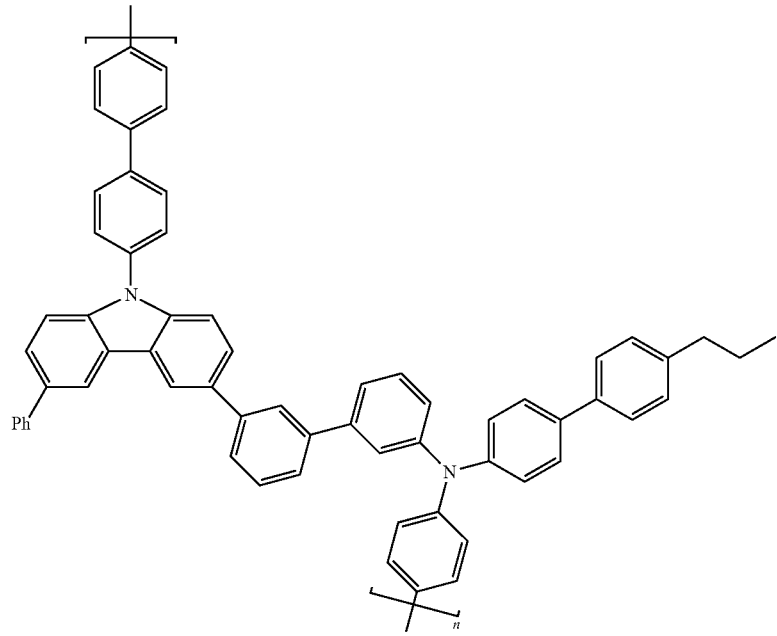
Compound H9

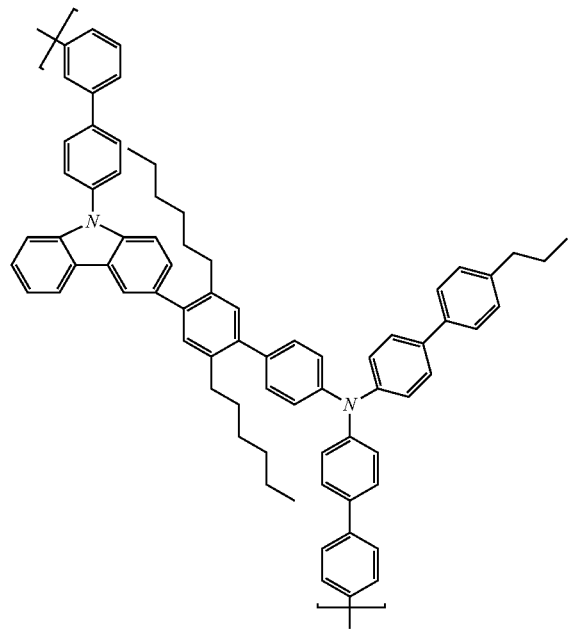
Compound H10

This disclosure also includes an organic electronic device comprising an anode, a cathode, and at least one organic active layer therebetween, wherein the organic active layer comprises a hole transport polymer having Formula I.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges.

Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A hole transport homopolymer having a carbazole group and an amino nitrogen, wherein said hole transport homopolymer has Formula I or Formula II

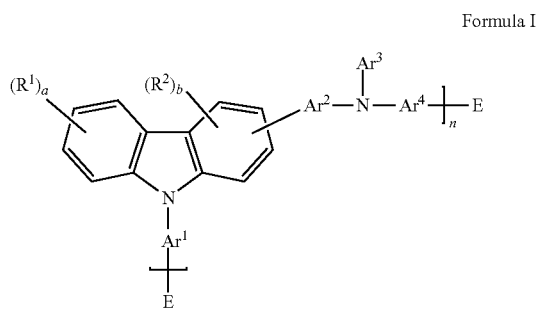

Formula I wherein:
Ar$^1$, Ar$^2$, and Ar$^4$ are the same or different and are substituted or unsubstituted aryl groups or deuterated aryl groups;
Ar$^3$ is substituted or unsubstituted aryl groups or deuterated aryl groups;
E is the same or different at each occurrence and is selected from the group consisting of H, D, halide, alkyl, aryl, siloxane, deuterated alkyl, deuterated aryl, deuterated siloxane, and a crosslinking group;
R$^1$-R$^2$ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from R$^1$ and R$^2$ can be joined together to form a fused ring;
a is an integer from 0-4;
b is an integer from 0-3; and
n is an integer greater than 10;

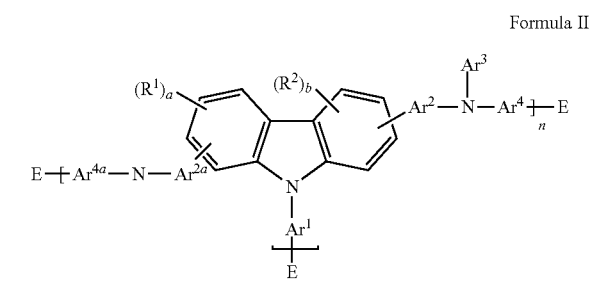

Formula II wherein:
Ar$^1$, Ar$^2$, Ar$^{2a}$, Ar$^4$, and Ar$^{4a}$ are the same or different and are substituted or unsubstituted aryl groups or deuterated aryl groups;
Ar$^3$ and Ar$^{3a}$ are substituted or unsubstituted aryl groups or deuterated aryl groups;
E is the same or different at each occurrence and is selected from the group consisting of H, D, halide, alkyl, aryl, siloxane, deuterated alkyl, deuterated aryl, deuterated siloxane, and a crosslinking group;
R$^1$-R$^2$ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from R$^1$ and R$^2$ can be joined together to form a fused ring;
b is an integer from 0-3; and
n is an integer greater than 10.

2. The hole transport homopolymer according to claim 1, in which Ar$^1$-Ar$^4$ are aryl groups at least one of which is further substituted with additional groups.

3. The hole transport homopolymer according to claim 2, in which the additional groups on the aryl groups are alkyl groups having 1 to 6 carbon atoms.

4. The hole transport homopolymer according to claim 1, in which at least one of a and b does not equal zero.

5. The hole transport homopolymer according to claim 1, in which the hole transport homopolymer contains at least one D.

6. An organic electronic device comprising an anode, a cathode, and at least one organic active layer therebetween, wherein the organic active layer comprises a hole transport homopolymer according to claim 1.

* * * * *